(12) United States Patent
Diev et al.

(10) Patent No.: US 12,227,620 B2
(45) Date of Patent: Feb. 18, 2025

(54) POLYMERS FOR USE IN ELECTRONIC DEVICES

(71) Applicant: DUPONT ELECTRONICS, INC., Wilmington, DE (US)

(72) Inventors: Viacheslav V Diev, Wilmington, DE (US); Nora Sabina Radu, Landenberg, PA (US); Michael Henry Howard, Jr., Montchanin, DE (US); Rakesh Nambiar, West Chester, PA (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 718 days.

(21) Appl. No.: 17/594,424

(22) PCT Filed: Apr. 21, 2020

(86) PCT No.: PCT/US2020/029056
§ 371 (c)(1),
(2) Date: Oct. 15, 2021

(87) PCT Pub. No.: WO2020/219411
PCT Pub. Date: Oct. 29, 2020

(65) Prior Publication Data
US 2022/0325045 A1 Oct. 13, 2022

Related U.S. Application Data

(60) Provisional application No. 62/898,851, filed on Sep. 11, 2019, provisional application No. 62/837,456, filed on Apr. 23, 2019.

(51) Int. Cl.
*C08G 73/10* (2006.01)
*C08J 5/18* (2006.01)

(52) U.S. Cl.
CPC ..... *C08G 73/1032* (2013.01); *C08G 73/1075* (2013.01); *C08J 5/18* (2013.01); *C08J 2379/08* (2013.01)

(58) Field of Classification Search
CPC ............ C08G 73/1042; C08G 73/1007; C08G 73/1039; C08J 5/18
See application file for complete search history.

(56) References Cited

U.S. PATENT DOCUMENTS

| | | |
|---|---|---|
| 5,166,308 A | 11/1992 | Kreuz et al. |
| 5,298,331 A | 3/1994 | Kanakarajan et al. |
| 5,310,863 A | 5/1994 | Sachdev |
| 7,318,964 B2 | 1/2008 | Cho et al. |
| 9,870,024 B2 | 1/2018 | Evans et al. |
| 10,276,640 B2 | 4/2019 | Chung et al. |
| 10,983,646 B2 | 4/2021 | Yoon et al. |
| 2007/0002130 A1 | 1/2007 | Hartkop |
| 2014/0307144 A1 | 10/2014 | Jeong |
| 2016/0222249 A1 | 8/2016 | Choi et al. |
| 2018/0260079 A1 | 9/2018 | Zhang |

FOREIGN PATENT DOCUMENTS

| | | |
|---|---|---|
| CN | 108440754 A | 8/2018 |
| EP | 3216819 A1 | 9/2017 |
| JP | S60221426 A | 11/1985 |
| JP | H0477586 A | 3/1992 |
| JP | H05112644 A | 5/1993 |
| JP | 06-255036 A | 9/1994 |

(Continued)

OTHER PUBLICATIONS

JP06-255036 Translation.

(Continued)

*Primary Examiner* — Gregory Listvoyb
(74) *Attorney, Agent, or Firm* — G. Creston Campbell

(57) ABSTRACT

Disclosed is a polyamic acid having Formula I

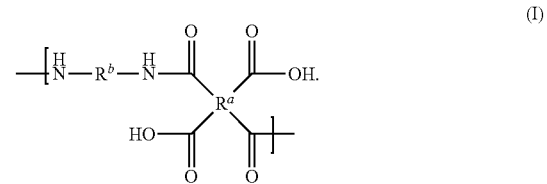

In Formula I: $R^a$ represents one or more different tetracarboxylic acid component residues; $R^b$ represents one or more different aromatic diamine residues or aromatic diisocyanate residues; and 5-100 mol % of $R^b$ has Formula II

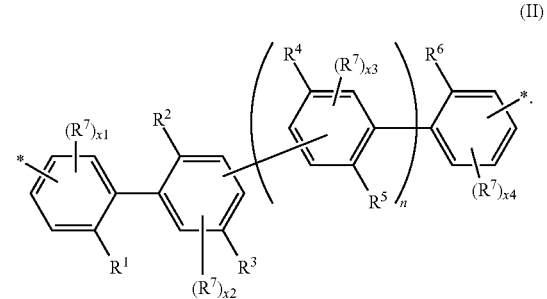

In Formula II: $R^1$ through $R^6$ are the same or different and are haloalkyl or haloalkoxy; $R^7$ is the same or different at each occurrence and is deuterium, halogen, cyano, hydroxyl, alkyl, deuterated alkyl, heteroalkyl, alkoxy, heteroalkoxy, haloalkyl, haloalkoxy, silyl, siloxy, hydrocarbon aryl, substituted hydrocarbon aryl, heteroaryl, substituted heteroaryl, vinyl, or allyl; n is an integer from 0-10; x1 and x4 are the same or different and are an integer from 0-3; x2 and x3 are the same or different and are an integer from 0-2; and * indicates a point of attachment.

20 Claims, 4 Drawing Sheets

(56) References Cited

FOREIGN PATENT DOCUMENTS

| KR | 10-2017-0076101 A | 7/2017 | | |
|---|---|---|---|---|
| KR | 10/1796875 B1 | 11/2017 | | |
| WO | 1993/004099 A1 | 3/1993 | | |
| WO | 2011/053334 A1 | 5/2011 | | |
| WO | 2017-112440 A1 | 6/2017 | | |
| WO | WO-2017111300 A1 * | 6/2017 | ........... | C07C 211/43 |
| WO | 2018/062428 A1 | 4/2018 | | |
| WO | 2018/097143 A1 | 10/2019 | | |

OTHER PUBLICATIONS

CRC Handbook of Chemistry and Physics, 81st Edition (2000-2001).
PCT International Search Report for PCT/US2020/029056; Da Won Jung, Authorized Officer; ISA/KR; Aug. 7, 2020.

* cited by examiner

POLYMERS FOR USE IN ELECTRONIC DEVICES

CLAIM OF BENEFIT OF PRIOR APPLICATION

This application claims the benefit of U.S. Provisional Application No. 62/837,456, filed Apr. 23, 2019, and U.S. Provisional Application No. 62/898,851, filed Sep. 11, 2019, both of which are incorporated in their entirety herein by reference.

BACKGROUND INFORMATION

Field of the Disclosure

The present disclosure relates to novel polymeric compounds. The disclosure further relates to methods for preparing such polymeric compounds and electronic devices having at least one layer comprising these materials.

Description of the Related Art

Materials for use in electronics applications often have strict requirements in terms of their structural, optical, thermal, electronic, and other properties. As the number of commercial electronics applications continues to increase, the breadth and specificity of requisite properties demand the innovation of materials with new and/or improved properties. Polyimides represent a class of polymeric compounds that has been widely used in a variety of electronics applications. They can serve as a flexible replacement for glass in electronic display devices provided that they have suitable properties. These materials can function as a component of Liquid Crystal Displays ("LCDs"), where their modest consumption of electrical power, light weight, and layer flatness are critical properties for effective utility. Other uses in electronic display devices that place such parameters at a premium include device substrates, substrates for color filter sheets, cover films, touch screen panels, and others.

A number of these components are also important in the construction and operation of organic electronic devices having an organic light emitting diode ("OLED"). OLEDs are promising for many display applications because of their high power conversion efficiency and applicability to a wide range of end-uses. They are increasingly being used in cell phones, tablet devices, handheld/laptop computers, and other commercial products. These applications call for displays with high information content, full color, and fast video rate response time in addition to low power consumption.

Polyimide films generally possess sufficient thermal stability, high glass transition temperature, and mechanical toughness to merit consideration for such uses. Also, polyimides generally do not develop haze when subject to repeated flexing, so they are often preferred over other transparent substrates like polyethylene terephthalate (PET) and polyethylene naphthalate (PEN) in flexible display applications.

The traditional amber color of polyimides, however, precludes their use in some display applications such as color filters and touch screen panels since a premium is placed on optical transparency. Further, polyimides are generally stiff, highly aromatic materials; and the polymer chains tend to orient in the plane of the film/coating as the film/coating is being formed. This leads to differences in refractive index in the parallel vs. perpendicular directions of the film (birefringence) which produces optical retardation that can negatively impact display performance.

There is thus a continuing need for polymer materials that are suitable for use in electronic devices.

SUMMARY

There is provided a polyamic acid having a repeat unit of Formula I

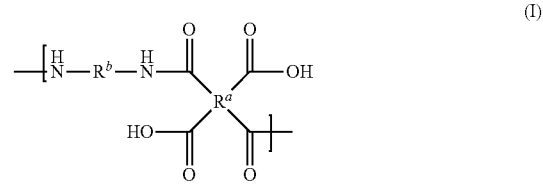

(I)

where:
- $R^a$ is the same or different at each occurrence and represents one or more tetracarboxylic acid component residues; and
- $R^b$ is the same or different at each occurrence and represents one or more aromatic diamine residues or aromatic diisocyanate residues;

wherein 5-100 mol % of $R^b$ has Formula II

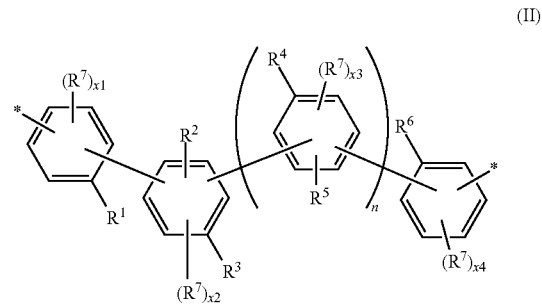

(II)

where:
- $R^1$ through $R^6$ are the same or different and are selected from the group consisting of haloalkyl and haloalkoxy;
- $R^7$ is the same or different at each occurrence and is selected from the group consisting of deuterium, halogen, cyano, hydroxyl, deuterated alkyl, heteroalkyl, alkoxy, heteroalkoxy, haloalkyl, haloalkoxy, silyl, siloxy, hydrocarbon aryl, substituted hydrocarbon aryl, heteroaryl, substituted heteroaryl, vinyl, and allyl;
- wherein any of $R^1$ through $R^7$ can be joined together with another of $R^1$ through $R^7$ on an adjacent ring to form a fused 5- or 6-membered alicyclic ring;
- n is an integer from 0-10;
- x1 and x4 are the same or different and are an integer from 0-3;
- x2 and x3 are the same or different and are an integer from 0-2; and
- * indicates a point of attachment.

There is further provided a composition comprising (a) the polyamic acid having a repeat unit of Formula I and (b) a high-boiling, aprotic solvent.

There is further provided a polyimide whose repeat units have the structure in Formula III

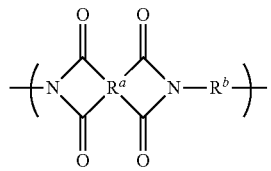

(III)

where $R^a$ and $R^b$ are as defined in Formula I.

There is further provided a polyimide film comprising the repeat unit of Formula III, wherein a 10 μm polyimide film has a Tg greater than 400° C. and a b* value less than 5.0.

There is further provided one or more methods for preparing a polyimide film wherein the polyimide film has the repeat unit of Formula III.

There is further provided a flexible replacement for glass in an electronic device wherein the flexible replacement for glass is a polyimide film having the repeat unit of Formula III.

There is further provided an electronic device having at least one layer comprising a polyimide film having the repeat unit of Formula III.

There is further provided an organic electronic device, such as an OLED, wherein the organic electronic device contains a flexible replacement for glass as disclosed herein.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
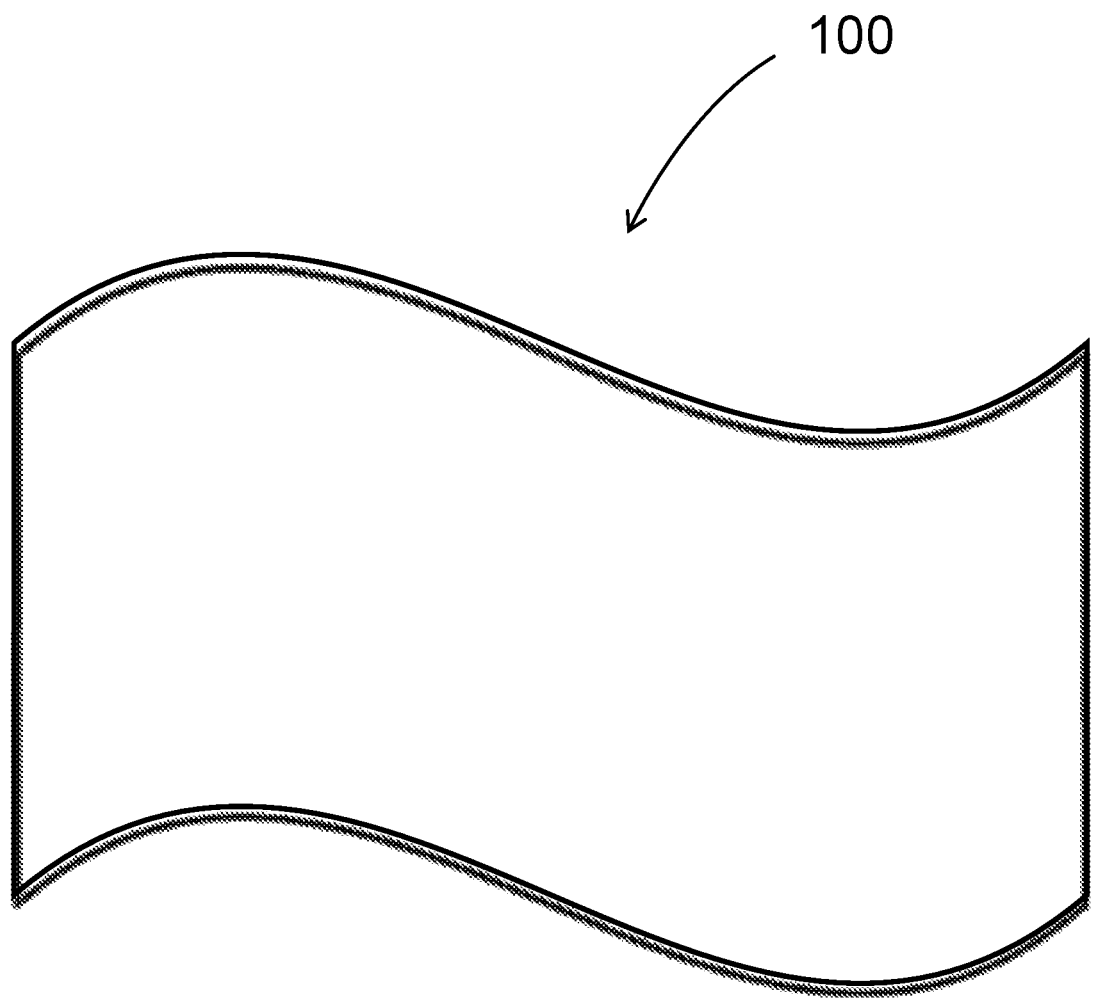
FIG. 1 includes an illustration of one example of a polyimide film that can act as a flexible replacement for glass.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is further provided a polyamic acid having repeat units of Formula I, as described in detail below.

There is further provided a composition comprising (a) the polyamic acid having repeat units of Formula I and (b) a high-boiling, aprotic solvent.

There is further provided a polyimide whose repeat units have the structure in Formula III, as described in detail below.

There is further provided one or more methods for preparing a polyimide film wherein the polyimide film has the repeat unit of Formula III.

There is further provided a flexible replacement for glass in an electronic device wherein the flexible replacement for glass is a polyimide film having the repeat unit of Formula III.

There is further provided an electronic device having at least one layer comprising a polyimide film having the repeat unit of Formula III.

There is further provided an organic electronic device, such as an OLED, wherein the organic electronic device contains a flexible replacement for glass as disclosed herein.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, followed by the Polyamic Acid, the Polyimide, the Methods for Preparing Polyimide Films, the Electronic Device, and finally Examples.

1. Definitions and Clarification of Terms

Before addressing details of embodiments described below, some terms are defined or clarified.

As used in the "Definitions and Clarification of Terms", R, $R^a$, $R^b$, R', R" and any other variables are generic designations and may be the same as or different from those defined in the formulas.

As used herein, the term "alicyclic" refers to a cyclic group that is not aromatic. The group can be saturated or unsaturated.

The term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "aprotic" refers to a class of solvents that lack an acidic hydrogen atom and are therefore incapable of acting as hydrogen donors. Common aprotic solvents include alkanes, carbon tetrachloride ($CCl_4$), benzene, dimethyl formamide (DMF), N-methyl-2-Pyrrolidone (NMP), dimethylacetamide (DMAc), and many others.

The term "aromatic compound" is intended to mean an organic compound comprising at least one unsaturated cyclic group having 4n+2 delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "aryl" or "aryl group" is intended to mean a moiety formed by removal of one or more hydrogen ("H") or deuterium ("D") from an aromatic compound. The aryl group may be a single ring (monocyclic) or have multiple rings (bicyclic, or more) fused together or linked covalently. A "hydrocarbon aryl" has only carbon atoms in the aromatic ring(s). A "heteroaryl" has one or more heteroatoms in at least one aromatic ring. In some embodiments, hydrocarbon aryl groups have 6 to 60 ring carbon atoms; in some embodiments, 6 to 30 ring carbon atoms. In some embodiments, heteroaryl groups have from 4-50 ring carbon atoms; in some embodiments, 4-30 ring carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include deuterium, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxy, siloxane, thioalkoxy, —S(O)$_2$—, —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

The term "amine" is intended to mean a compound that contains a basic nitrogen atom with a lone pair, where lone pair refers to a set of two valence electrons that are not shared with another atom. The term "amino" refers to the functional group —NH$_2$, —NHR, or —NR$_2$, where R is the same or different at each occurrence and can be an alkyl group or an aryl group. The term "diamine" is intended to mean a compound that contains two basic nitrogen atoms with associated lone pairs. The term "polyamine" is intended to mean a compound that contains two or more basic nitrogen atoms with associated lone pairs. The term "aromatic diamine" is intended to mean an aromatic compound having two amino groups. The term "aromatic polyamine" is intended to mean an aromatic compound having two or more amino groups. The term "bent diamine" is intended to mean a diamine wherein the two basic nitrogen atoms and associated lone pairs are asymmetrically disposed about the center of symmetry of the corresponding compound or functional group, e.g. m-phenylenediamine:

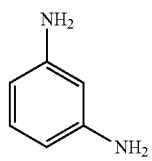

The term "aromatic diamine residue" is intended to mean the moiety bonded to the two amino groups in an aromatic diamine. The term "aromatic polyamine residue" is intended to mean the moiety bonded to the two or more amino groups in an aromatic polyamine. The term "aromatic diisocyanate residue" is intended to mean the moiety bonded to the two isocyanate groups in an aromatic diisocyanate compound. The term "aromatic polyisocyanate residue" is intended to mean the moiety bonded to the two or more isocyanate groups in an aromatic polyisocyanate compound. This is further illustrated below.

The terms "diamine residue" and "diisocyanate residue" are intended to mean the moiety bonded to two amino groups or two isocyanate groups, respectively, where the moiety is aliphatic or aromatic. The terms "polyamine residue" and "polyisocyanate residue" are intended to mean the moiety bonded to two or more amino groups or two or more isocyanate groups, respectively, where the moiety is aliphatic or aromatic.

The term "b*" is intended to mean the b* axis in the CIELab Color Space that represents the yellow/blue opponent colors. Yellow is represented by positive b* values, and blue is represented by negative b* values. Measured b* values may be affected by solvent, particularly since solvent choice may affect color measured on materials exposed to high-temperature processing conditions. This may arise as the result of inherent properties of the solvent and/or properties associated with low levels of impurities contained in various solvents. Particular solvents are often preselected to achieve desired b* values for a particular application.

The term "birefringence" is intended to mean the difference in the refractive index in different directions in a polymer film or coating. This term usually refers to the difference between the x- or y-axis (in-plane) and the z-axis (out-of-plane) refractive indices.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "linear coefficient of thermal expansion (CTE or $\alpha$)" is intended to mean the parameter that defines the amount which a material expands or contracts as a function of temperature. It is expressed as the change in length per degree Celsius and is generally expressed in units of $\mu m/m/°C$ or $ppm/°C$.

$$\alpha=(\Delta L/L_0)/\Delta T$$

Measured CTE values disclosed herein are made via known methods during the first or second heating scan. The understanding of the relative expansion/contraction characteristics of materials can be an important consideration in the fabrication and/or reliability of electronic devices.

The term "deuterated" is intended to mean that at least one hydrogen ("H") has been replaced by deuterium ("D"). The term "deuterated analog" refers to an analog of a compound or group having the same structure, but in which one or more available hydrogens have been replaced with deuterium. In a deuterated compound or deuterated analog, the deuterium is present in at least 100 times the natural abundance level. The term "% deuterated" or "% deuteration" is intended to mean the ratio of deuterons to the sum of protons plus deuterons, expressed as a percentage. The notation shown below

[Compound structure]—$D_{x-y}$ indicates that the compound is deuterated at any available position and that the total number of deuterium substituents is from x to y. For example, the compound shown below has 8-10 deuterium substituents at any available position

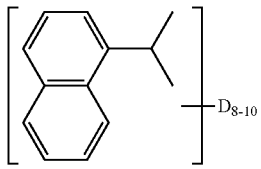

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "tensile elongation" or "tensile strain" is intended to mean the percentage increase in length that occurs in a material before it breaks under an applied tensile stress. It can be measured, for example, by ASTM Method D882.

The prefix "fluoro" is intended to indicate that one or more hydrogens in a group have been replaced with fluorine.

The term "glass transition temperature (or $T_g$)" is intended to mean the temperature at which a reversible change occurs in an amorphous polymer or in amorphous regions of a semi crystalline polymer where the material changes suddenly from a hard, glassy, or brittle state to one that is flexible or elastomeric. Microscopically, the glass transition occurs when normally-coiled, motionless polymer chains become free to rotate and can move past each other. $T_g$'s may be measured using differential scanning calorimetry (DSC), thermo-mechanical analysis (TMA), or dynamic-mechanical analysis (DMA), or other methods.

The term "haloalkyl" is intended to indicate an alkyl group having one or more hydrogen atoms replaced by a halogen atom.

The term "haloalkoxy" is intended to indicate an alkoxy group having one or more hydrogen atoms replaced by a halogen atom.

The prefix "hetero" indicates that one or more carbon atoms have been replaced with a different atom. In some embodiments, the heteroatom is O, N, S, or combinations thereof.

The term "high-boiling" is intended to indicate a boiling point greater than 130° C.

The term "host material" is intended to mean a material to which a dopant is added. The host material may or may not have electronic characteristic(s) or the ability to emit, receive, or filter radiation. In some embodiments, the host material is present in higher concentration.

The term "isothermal weight loss" is intended to mean a material's property that is directly related to its thermal stability. It is generally measured at a constant temperature of interest via thermogravimetric analysis (TGA). Materials that have high thermal stability generally exhibit very low percentages of isothermal weight loss at the required use or processing temperature for the desired period of time and can therefore be used in applications at these temperatures without significant loss of strength, outgassing, and/or change in structure.

The term "laser particle counter test" refers to a method used to assess the particle content of polyamic acid and other polymeric solutions whereby a representative sample of a test solution is spin coated onto a 5" silicon wafer and soft baked/dried. The film thus prepared is evaluated for particle content by any number of standard measurement techniques. Such techniques include laser particle detection and others known in the art.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "matrix" is intended to mean a foundation on which one or more layers is deposited in the formation of, for example, an electronic device. Non-limiting examples include glass, silicon, and others.

The term "1% TGA Weight Loss" is intended to mean the temperature at which 1% of the original polymer weight is lost due to decomposition (excluding absorbed water).

The term "optical retardation (or $R_{TH}$)" is intended to mean the difference between the average in-plane refractive index and the out-of-plane refractive index (i.e., the birefringence), this difference then being multiplied by the thickness of the film or coating. Optical retardation is typically measured for a given frequency of light, and the units are reported in nanometers.

The term "organic electronic device" or sometimes "electronic device" is herein intended to mean a device including one or more organic semiconductor layers or materials.

The term "particle content" is intended to mean the number or count of insoluble particles that is present in a solution. Measurements of particle content can be made on the solutions themselves or on finished materials (pieces, films, etc.) prepared from those films. A variety of optical methods can be used to assess this property.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "polyamic acid solution" refers to a solution of a polymer containing amic acid units that have the capability of intramolecular cyclization to form imide groups.

The term "polyanhydride" refers to a compound having two or more acid anhydride groups. The term "polyanhydride residue" is intended to mean the moiety bonded to the two or more anhydride groups. This is further illustrated below.

The term "polyimide" refers to condensation polymers resulting from the reaction of one or more bifunctional carboxylic acid components with one or more primary diamines or diisocyanates. They contain the imide structure —CO—NR—CO— as a linear or heterocyclic unit along the main chain of the polymer backbone.

The term "satisfactory," when regarding a materials property or characteristic, is intended to mean that the property or characteristic fulfills all requirements/demands for the material in-use. For example, an isothermal weight loss of less than 1% at 350° C. for 3 hours in nitrogen can be viewed as a non-limiting example of a "satisfactory" property in the context of the polyimide films disclosed herein.

The term "soft-baking" is intended to mean a process commonly used in electronics manufacture wherein coated materials are heated to drive off solvents and solidify a film. Soft-baking is commonly performed on a hot plate or in exhausted oven at temperatures between 90° C. and 110° C. as a preparation step for subsequent thermal treatment of coated layers or films.

The term "substrate" refers to a base material that can be either rigid or flexible and may include one or more layers of one or more materials, which can include, but are not limited to, glass, polymer, metal or ceramic materials or combinations thereof. The substrate may or may not include electronic components, circuits, or conductive members.

The term "siloxane" refers to the group $R_3SiOR_2Si—$, where R is the same or different at each occurrence and is H, C1-20 alkyl, fluoroalkyl, or aryl. In some embodiments, one or more carbons in an R alkyl group are replaced with Si.

The term "siloxy" refers to the group $R_3SiO—$, where R is the same or different at each occurrence and is H, C1-20 alkyl, fluoroalkyl, or aryl.

The term "silyl" refers to the group $R_3Si—$, where R is the same or different at each occurrence and is H, C1-20 alkyl,

| Polyanhydride | Residue |
|---|---|

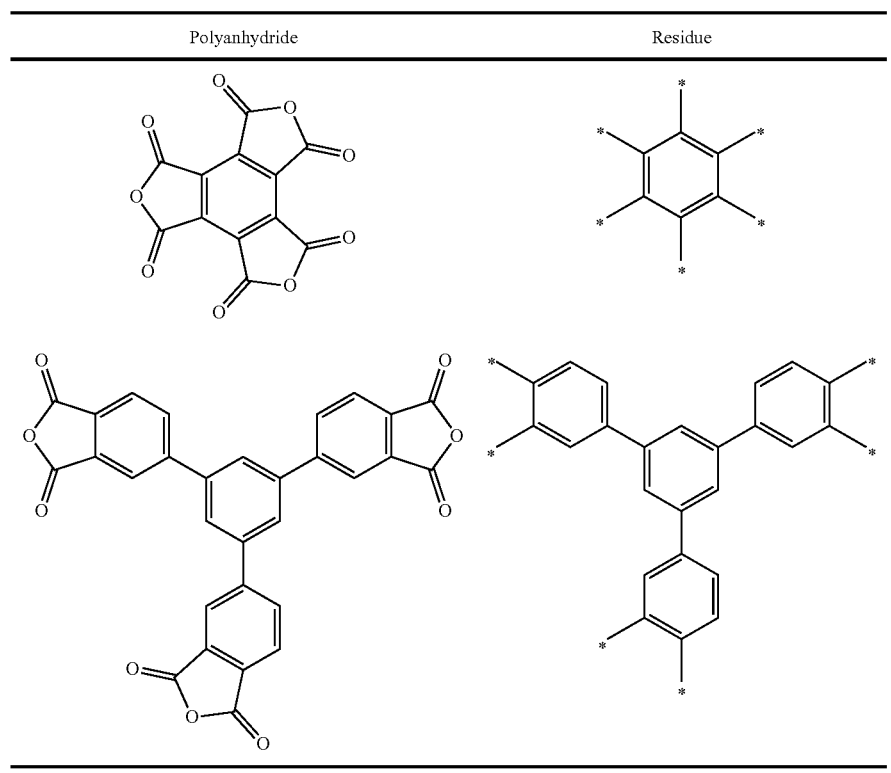

fluoroalkyl, or aryl. In some embodiments, one or more carbons in an R alkyl group are replaced with Si.

The term "spin coating" is intended to mean a process used to deposit uniform thin films onto flat substrates. Generally, a small amount of coating material is applied on the center of the substrate, which is either spinning at low speed or not spinning at all. The substrate is then rotated at specified speeds in order to spread the coating material uniformly by centrifugal force.

The term "tensile modulus" is intended to mean the measure of the stiffness of a solid material that defines the initial relationship between the stress (force per unit area) and the strain (proportional deformation) in a material like a film. Commonly used units are giga pascals (GPa).

The term "tetracarboxylic acid component" is intended to mean any one or more of the following: a tetracarboxylic acid, a tetracarboxylic acid monoanhydride, a tetracarboxylic acid dianhydride, a tetracarboxylic acid monoester, and a tetracarboxylic acid diester.

The term "tetracarboxylic acid component residue" is intended to mean the moiety bonded to the four carboxy groups in a tetracarboxylic acid component. This is further illustrated below.

duced using NMP as a solvent. This may arise as the result of inherent properties of the solvent and/or properties associated with low levels of impurities contained in various solvents. Particular solvents are often preselected to achieve desired YI values for a particular application.

In a structure where a substituent bond passes through one or more rings as shown below,

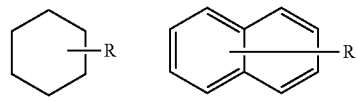

it is meant that the substituent R may be bonded at any available position on the one or more rings.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). Exemplary adjacent R groups are shown below:

| Tetracarboxylic acid component | Residue |
|---|---|
| | |

The term "transmittance" refers to the percentage of light of a given wavelength impinging on a film that passes through the film so as to be detectable on the other side. Light transmittance measurements in the visible region (380 nm to 800 nm) are particularly useful for characterizing film-color characteristics that are most important for understanding the properties-in-use of the polyimide films disclosed herein.

The term "yellowness index (or YI)" refers to the magnitude of yellowness relative to a standard. A positive value of YI indicates the presence, and magnitude, of a yellow color. Materials with a negative YI appear bluish. It should also be noted, particularly for polymerization and/or curing processes run at high temperatures, that YI can be solvent dependent. The magnitude of color introduced using DMAC as a solvent, for example, may be different than that intro-

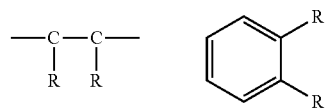

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC Handbook of Chemistry and Physics, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Polyamic Acid

The polyamic acid described herein has a repeat unit structure of Formula I

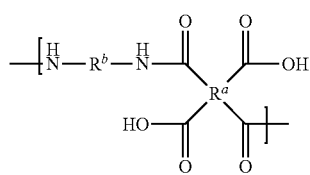
(I)

where:
R$^a$ represents one or more different tetracarboxylic acid component residues; and
R$^b$ represents one or more different aromatic diamine residues or aromatic diisocyanate residues;

wherein 5-100 mol % of R$^b$ has Formula II

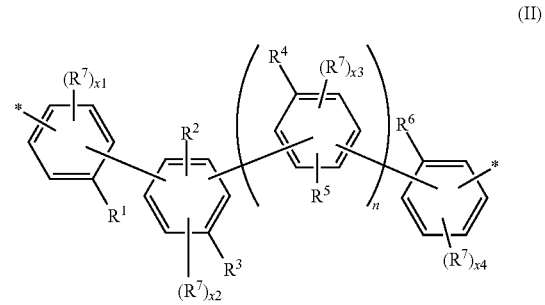
(II)

where R$^1$ through R$^7$, n, x1 through x4, and * are as defined above.

In some embodiments of Formula I, R$^a$ represents a single tetracarboxylic acid component residue.

In some embodiments of Formula I, R$^a$ represents two tetracarboxylic acid component residues.

In some embodiments of Formula I, R$^a$ represents three tetracarboxylic acid residues.

In some embodiments of Formula I, R$^a$ represents four tetracarboxylic acid residues.

In some embodiments of Formula I, R$^a$ represents one or more tetracarboxylic acid dianhydride residues.

Examples of suitable aromatic tetracarboxylic acid dianhydrides include, but are not limited to, pyromellitic dianhydride (PMDA), 3,3',4,4'-biphenyl tetracarboxylic dianhydride (BPDA), 2,3,3',4'-biphenyl tetracarboxylic dianhydride (s-BPDA), 4,4'-oxydiphthalic anhydride (ODPA), 4,4'-hexafluoroiso-propylidenebisphthalic dianhydride (6F-DA), 3,3',4,4'-benzophenone tetracarboxylic dianhydride (BTDA), bis(1,3-dioxo-1,3-dihydroisobenzofuran-5-carboxylic acid) 1,4-phenylene ester (TAHQ), 3,3',4,4'-diphenylsulfone tetracarboxylic dianhydride (DSDA), 4,4'-bisphenol-A dianhydride (BPADA), 1,3,3a, 4,5,9b-hexahydro-5 (tetrahydro-2,5-dioxo-3-furanyl) naphtho [1,2-c] tetracarboxylic dianhydride (TDA), norbornane-2-spiro-α-cyclopentanone-α'-spiro-2"-norbornane-5,5",6,6"-tetracarboxylic dianhydride (CpODA), 1,2:3,4-cyclobutanetetracarboxylic dianhydride (CBDA), hydroquinone diphthalic anhydride (HQDEA), ethylene glycol bis (trimellitic anhydride) (TMEG-100), 4-(2,5-dioxotetrahydrofuran-3-yl)-1,2,3,4-tetrahydronapthalene-1,2-dicarboyxlic anhydride (DTDA), 4,4'-bisphenol A dianhydride (BPADA), xanthene tetracarboxylic dianhydride, and the like, and combinations thereof. These aromatic dianhydrides may optionally be substituted with groups that are known in the art including alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, fluoroalkyl, perfluoroalkyl, fluoroalkoxy, perfluoroalkoxy, arylalkyl, silyl, siloxy, siloxane, thioalkoxy, —S(O)$_2$—, —C(=O)— N(R')(R"), (R')(R")N-alkyl, (R')(R")N-alkoxyalkyl, (R')(R") N-alkylaryloxyalkyl, —S(O)$_s$-aryl (where s=0-2) or —S (O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

In some embodiments of Formula I, R$^a$ represents one or more residues from tetracarboxylic acid dianhydrides selected from the group consisting of PMDA, BPDA, s-BPDA, DSDA, 6FDA, TDA, BTDA, ODPA, and CpODA.

In some embodiments of Formula I, R$^a$ represents a PMDA residue.

In some embodiments of Formula I, $R^a$ represents a BPDA residue.

In some embodiments of Formula I, $R^a$ represents a s-BPDA residue.

In some embodiments of Formula I, $R^a$ represents a DSDA residue.

In some embodiments of Formula I, $R^a$ represents a 6FDA residue.

In some embodiments of Formula I, $R^a$ represents a TDA residue.

In some embodiments of Formula I, $R^a$ represents a BTDA residue.

In some embodiments of Formula I, $R^a$ represents a ODPA residue.

In some embodiments of Formula I, $R^a$ represents a CpODA residue.

In some embodiments of Formula I, $R^a$ represents a PMDA residue and a BPDA residue.

In some embodiments of Formula I, $R^a$ represents a PMDA residue and a 6FDA residue.

In some embodiments of Formula I, $R^a$ represents a PMDA residue and a BTDA residue.

In some embodiments of Formula I, $R^a$ represents a BPDA residue and a 6FDA residue.

In some embodiments of Formula I, $R^a$ represents a BPDA residue and a BTDA residue.

In some embodiments of Formula I, $R^a$ represents a 6FDA residue and a BTDA residue.

In some embodiments of Formula I, $R^a$ represents a PMDA residue, a 6FDA residue, and a BPDA residue.

In some embodiments of Formula I, $R^a$ represents a PMDA residue, a 6FDA residue, and a BTDA residue.

In some embodiments of Formula I, $R^a$ represents a PMDA residue, a BTDA residue, and a BPDA residue.

In some embodiments of Formula I, $R^a$ represents a BTDA residue, a 6FDA residue, and a BPDA residue.

In Formula I, 5-100 mol % of $R^b$ represents a diamine residue having Formula II, as shown above. In some embodiments of Formula I, 10-100 mol % of $R^b$ has Formula II; in some embodiments, 20-100 mol %; in some embodiments, 50-100 mol %; in some embodiments, 20-90 mol %; in some embodiments, 30-80 mol %; in some embodiments, 50-70 mol %; in some embodiments, 100 mol %.

In some embodiments of Formula II, n=0.
In some embodiments of Formula II, n=1.
In some embodiments of Formula II, n=2.
In some embodiments of Formula II, n=3.
In some embodiments of Formula II, n=4.
In some embodiments of Formula II, n=5.
In some embodiments of Formula II, n=6.
In some embodiments of Formula II, n=7.
In some embodiments of Formula II, n=8.
In some embodiments of Formula II, n=9.
In some embodiments of Formula II, n=10.
In some embodiments of Formula II, n=3-10.
In some embodiments of Formula II, n=4-7.

In some embodiments of Formula I, 5-100 mol % of $R^b$ represents a mixture of diamine oligomers having Formula I with different numbers of monomer units.

In some embodiments of Formula I, $R^b$ is deuterated. In some embodiments, $R^b$ is at least 10% deuterated; in some embodiments, at least 30% deuterated; in some embodiments, at least 50% deuterated; in some embodiments, at least 70% deuterated; in some embodiments, at least 90% deuterated.

In some embodiments of Formula II, $R^1$ is a $C_{1-5}$ fluoroalkyl.

In some embodiments of Formula II, $R^1$ is a $C_{1-3}$ perfluoroalkyl; in some embodiments trifluoromethyl.

In some embodiments of Formula II, $R^1$ is a $C_{1-5}$ fluoroalkoxy.

In some embodiments of Formula II, $R^1$ is a $C_{1-3}$ perfluoroalkoxy; in some embodiments trifluoromethoxy.

All of the above-described embodiments for $R^1$, apply equally to $R^2$ through $R^6$.

In some embodiments of Formula II, $R^1=R^6$.
In some embodiments of Formula II, $R^2=R^3$.
In some embodiments of Formula II, $R^4=R^5$.
In some embodiments of Formula II, $R^1 \neq R^6$.
In some embodiments of Formula II, $R^2 \neq R^3$.
In some embodiments of Formula II, $R^4 \neq R^5$.
In some embodiments of Formula II, x1=0.
In some embodiments of Formula II, x1=1.
In some embodiments of Formula II, x1=2.
In some embodiments of Formula II, x1=3.
In some embodiments of Formula II, x1>0.
In some embodiments of Formula II, x2=0.
In some embodiments of Formula II, x2=1.
In some embodiments of Formula II, x2=2.
In some embodiments of Formula II, x2>0.
In some embodiments of Formula II, x3=0.
In some embodiments of Formula II, x3=1.
In some embodiments of Formula II, x3=2.
In some embodiments of Formula II, x3>0.
In some embodiments of Formula II, x4=0.
In some embodiments of Formula II, x4=1.
In some embodiments of Formula II, x4=2.
In some embodiments of Formula II, x4=3.
In some embodiments of Formula II, x4>0.

In some embodiments of Formula II, at least one of x1 through x4 is greater than 0.

In some embodiments of Formula II, $R^7$ is selected from the group consisting of deuterium, fluoro, alkyl, deuterated alkyl, fluoroalkyl, alkoxy, and fluoroalkoxy.

In some embodiments of Formula II, at least one $R^7$ is deuterium.

In some embodiments of Formula II, at least one $R^7$ is F.

In some embodiments of Formula II, at least one $R^7$ is a $C_{1-5}$ alkyl.

In some embodiments of Formula II, at least one $R^7$ is a deuterated $C_{1-5}$ alkyl.

In some embodiments of Formula II, at least one $R^7$ is a $C_{1-5}$ fluoroalkyl.

In some embodiments of Formula II, at least one $R^7$ is a $C_{1-3}$ perfluoroalkyl; in some embodiments trifluoromethyl.

In some embodiments of Formula II, at least one $R^7$ is a $C_{1-5}$ alkoxy.

In some embodiments of Formula II, at least one $R^7$ is a $C_{1-5}$ fluoroalkoxy.

In some embodiments of Formula II, at least one $R^7$ is a $C_{1-3}$ perfluoroalkoxy; in some embodiments trifluoromethoxy.

In some embodiments of Formula II, R groups on adjacent rings are joined together to form a fused 5- or 6-membered alicyclic ring. The alicyclic ring has a least one halo substituent.

In some embodiments of Formula II, $R^1$ is joined together with $R^2$.

In some embodiments of Formula II, $R^1$ is joined together with $R^7$ on the adjacent ring.

In some embodiments of Formula II, $R^2$ is joined together with $R^7$ on the adjacent ring.

In some embodiments of Formula II, $R^3$ is joined together with $R^4$.

In some embodiments of Formula II, $R^3$ is joined together with $R^7$ on the adjacent ring.

In some embodiments of Formula II, $R^4$ is joined together with $R^7$ on the adjacent ring.

In some embodiments of Formula II, $R^5$ is joined together with $R^6$.

In some embodiments of Formula II, $R^5$ is joined together with $R^7$ on the adjacent ring.

In some embodiments of Formula II, $R^6$ is joined together with $R^7$ on the adjacent ring.

In some embodiments of Formula I, 5-100 mol % of $R^b$ has Formula IIA

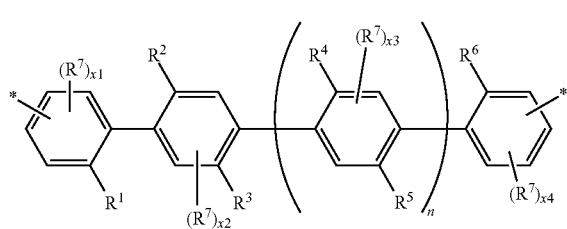

(IIA)

where $R^1$ through $R^7$, n, x1 through x4, and * are as defined above in Formula II. All of the above-described embodiments for $R^1$ through $R^7$, n, and x1 through x4 in Formula II, apply equally to $R^1$ through $R^7$, n, and x1 through x4 in Formula IIA.

In some embodiments of Formula I, 5-100 mol % of $R^b$ has Formula IIA-1

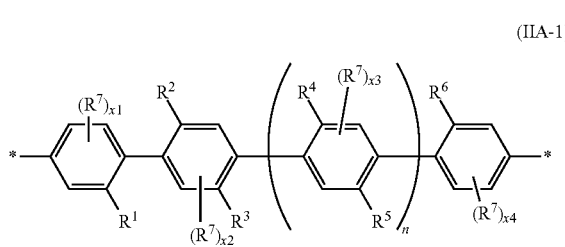

(IIA-1)

where $R^1$ through $R^7$, n, x1 through x4, and * are as defined above in Formula II. All of the above-described embodiments for $R^1$ through $R^7$, n, and x1 through x4 in Formula II, apply equally to $R^1$ through $R^7$, n, and x1 through x4 in Formula IIA-1.

In some embodiments of Formula I, 5-100 mol % of $R^b$ has Formula IIA-2

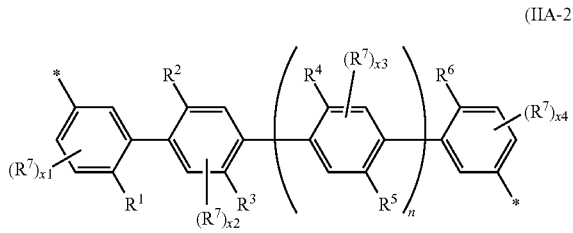

(IIA-2)

where $R^1$ through $R^7$, n, x1 through x4, and * are as defined above in Formula II. All of the above-described embodiments for $R^1$ through $R^7$, n, and x1 through x4 in Formula II, apply equally to $R^1$ through $R^7$, n, and x1 through x4 in Formula IIA-2.

In some embodiments of Formula I, 5-100 mol % of $R^b$ has Formula IIB

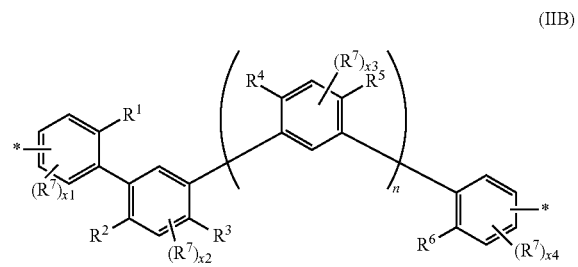

(IIB)

where $R^1$ through $R^7$, n, x1 through x4, and * are as defined above in Formula II. All of the above-described embodiments for $R^1$ through $R^7$, n, and x1 through x4 in Formula II, apply equally to $R^1$ through $R^7$, n, and x1 through x4 in Formula IIB.

In some embodiments of Formula I, 5-100 mol % of $R^b$ has Formula IIB-1

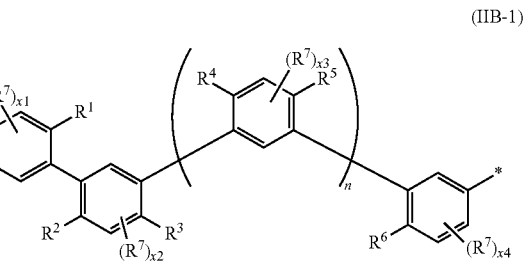

(IIB-1)

where $R^1$ through $R^7$, n, x1 through x4, and * are as defined above in Formula II. All of the above-described embodiments for $R^1$ through $R^7$, n, and x1 through x4 in Formula II, apply equally to $R^1$ through $R^7$, n, and x1 through x4 in Formula IIB-1.

In some embodiments of Formula I, 5-100 mol % of $R^b$ has Formula IIB-2

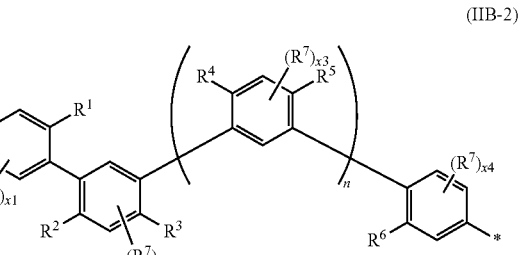

(IIB-2)

where $R^1$ through $R^7$, n, x1 through x4, and * are as defined above in Formula II. All of the above-described embodiments for $R^1$ through $R^7$, n, and x1 through x4 in Formula II, apply equally to $R^1$ through $R^7$, n, and x1 through x4 in Formula IIB-2.

Any of the above embodiments for Formula II can be combined with one or more of the other embodiments, so long as they are not mutually exclusive. For example, the embodiment in which x1=1 can be combined with the embodiment in which $R^7$ is F and the embodiment in which n=4.

The same is true for the other non-mutually-exclusive embodiments discussed above. The skilled person would understand which embodiments were mutually exclusive and would thus readily be able to determine the combinations of embodiments that are contemplated by the present application.

Any of the above embodiments for Formula I can be combined with one or more of the other embodiments, and can be combined with any of the embodiments for Formula II, so long as they are not mutually exclusive.

In some embodiments of Formula I, $R^b$ represents a residue from a diamine selected from the group consisting of Compound II-1 through II-26, shown below.

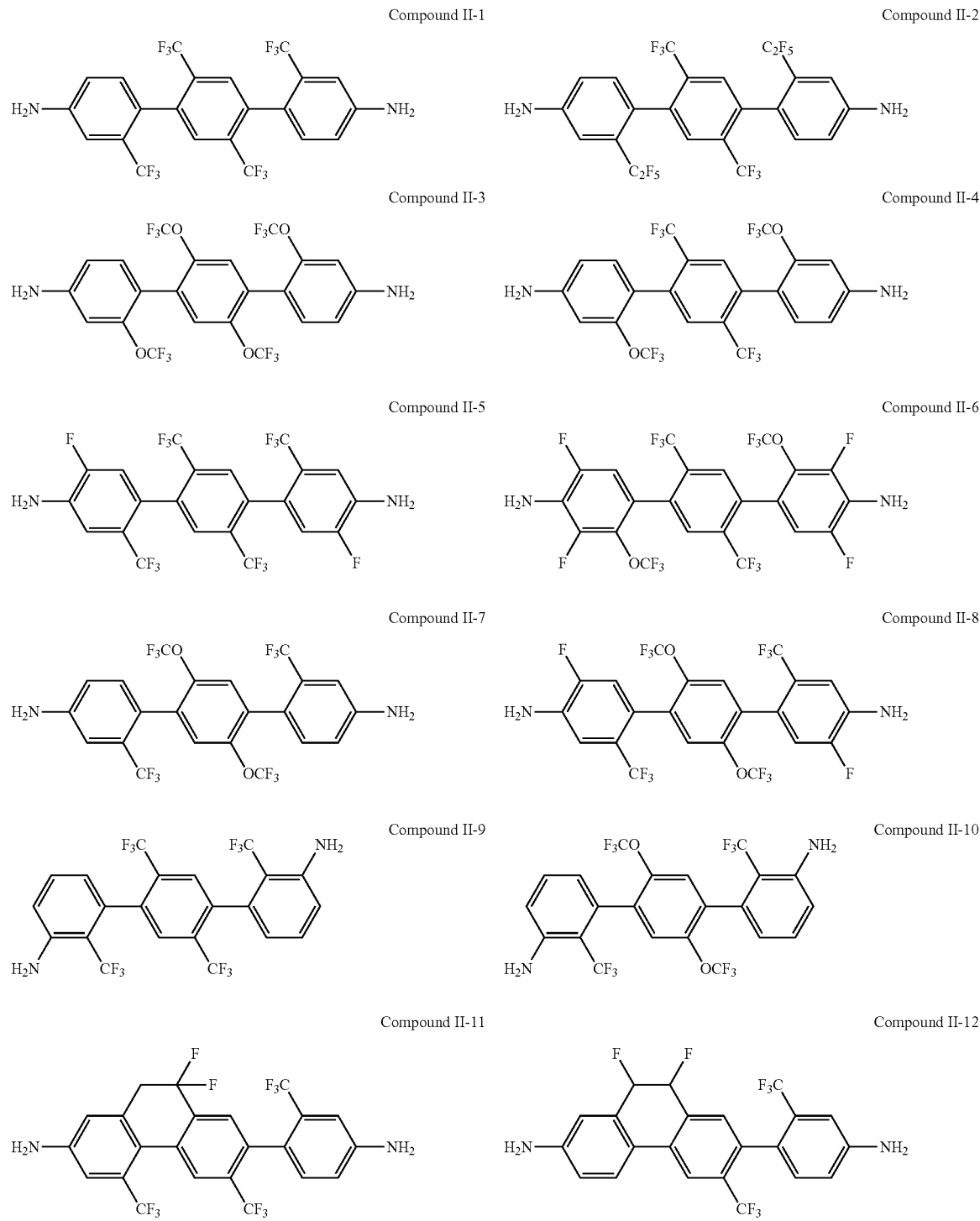

-continued
Compound II-13
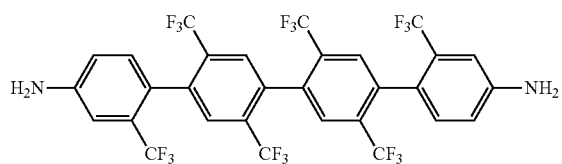
Compound II-14
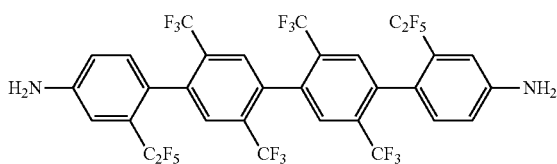
Compound II-15
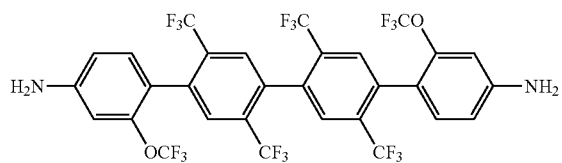
Compound II-16
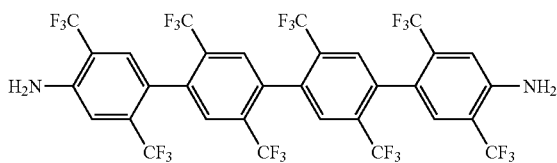
Compound II-17
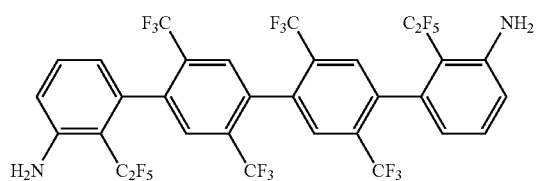
Compound II-18
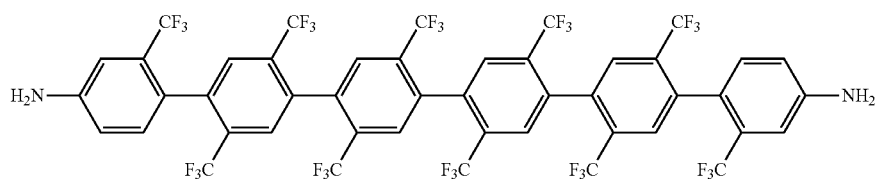
Compound II-19
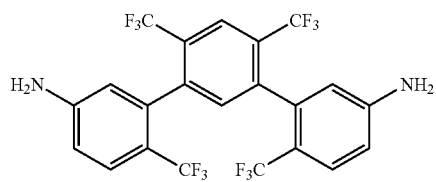
Compound II-20
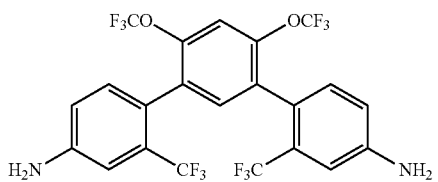
Compound II-21
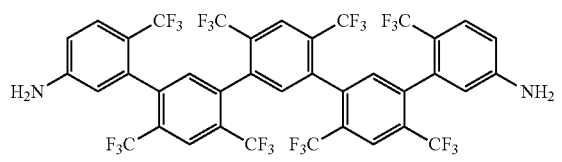
Compound II-22
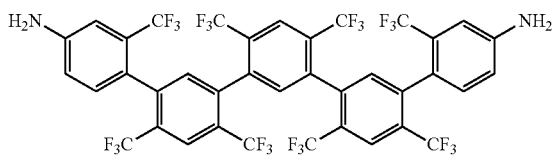
Compound II-23
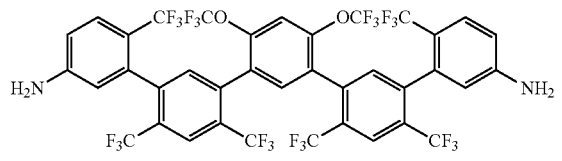
Compound II-24
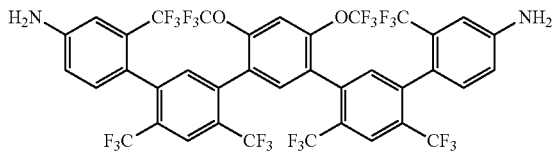
Compound II-25
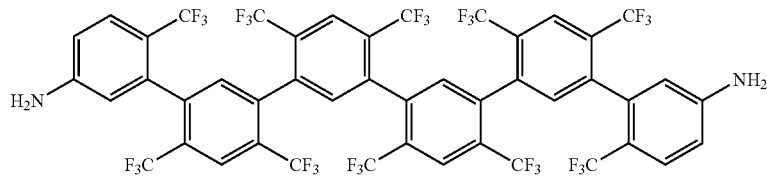

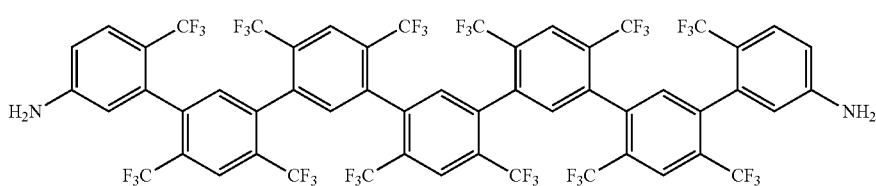

Compound II-26

In some embodiments of Formula I, $R^b$ represents a residue from a diamine selected from the group consisting of deuterated analogs of Compounds II-1 through II-26. In some embodiments, the diamine is at least 20% deuterated; in some embodiments, at least 50% deuterated; in some embodiments, at least 75% deuterated. One example of a deuterated analog is Compound II-27, shown below.

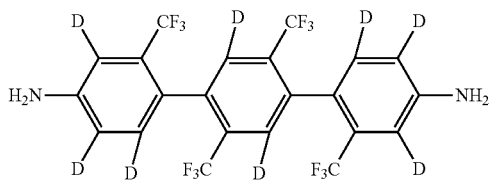

Compound II-27

The above diamines can be can be made using any technique that will yield a C—C, C—N, C—O, C—S, or C—Si bond. A variety of such techniques are known, such as Suzuki, Yamamoto, Stille, Negishi, and metal-catalyzed C—N couplings as well as metal catalyzed and oxidative direct arylation. Deuterated compounds can be prepared in a similar manner using deuterated precursor materials or, more generally, by treating the non-deuterated compound with deuterated solvent, such as benzene-d6, in the presence of a Bronsted or Lewis acid H/D exchange catalyst, such as trifluoromethanesulfonic acid, aluminum trichloride or ethyl aluminum dichloride. Deuteration reactions have also been described in published PCT application WO2011/053334. Exemplary preparations are given in the Examples.

In some embodiments of Formula I, 5-100 mol % of $R^b$ represents a diamine residue having Formula II, as shown above.

In some embodiments of Formula I, 5-100 mol % of $R^b$ represents a diamine residue from two or more different diamines each of which has Formula II, as shown above.

In some embodiments of Formula I, $R^b$ represents a diamine residue having Formula II and at least one additional diamine residue.

In some embodiments of Formula I, $R^b$ represents a diamine residue having Formula II and one additional diamine residue.

In some embodiments of Formula I, $R^b$ represents a diamine residue having Formula II and two additional diamine residues.

In some embodiments of Formula I, $R^b$ represents a diamine residue having Formula II and three additional diamine residues.

In some embodiments, the additional aromatic diamine is selected from the group consisting of p-phenylene diamine (PPD), 2,2'-dimethyl-4,4'-diaminobiphenyl (m-tolidine), 3,3'-dimethyl-4,4'-diaminobiphenyl (o-tolidine), 3,3'-dihydroxy-4,4'-diaminobiphenyl (HAB), 9,9'-bis(4-aminophenyl)fluorene (FDA), o-tolidine sulfone (TSN), 2,3,5,6-tetramethyl-1,4-phenylenediamine (TMPD), 2,4-diamino-1,3,5-trimethyl benzene (DAM), 3,3',5,5'-tetramethylbenzidine (3355TMB), 2,2'-bis(trifluoromethyl) benzidine (22TFMB or TFMB), 2,2-bis[4-(4-aminophenoxy)phenyl]propane (BAPP), 4,4'-methylene dianiline (MDA), 4,4'-[1,3-phenylenebis(1-methyl-ethylidene)]bisaniline (Bis-M), 4,4'-[1,4-phenylenebis(1-methyl-ethylidene)]bisaniline (Bis-P), 4,4'-oxydianiline (4,4'-ODA), m-phenylene diamine (MPD), 3,4'-oxydianiline (3,4'-ODA), 3,3'-diaminodiphenyl sulfone (3,3'-DDS), 4,4'-diaminodiphenyl sulfone (4,4'-DDS), 4,4'-diaminodiphenyl sulfide (ASD), 2,2-bis[4-(4-amino-phenoxy)phenyl]sulfone (BAPS), 2,2-bis[4-(3-aminophenoxy)phenyl]sulfone (m-BAPS), 1,4'-bis(4-aminophenoxy)benzene (TPE-Q), 1,3'-bis(4-aminophenoxy)benzene (TPE-R), 1,3'-bis(4-amino-phenoxy)benzene (APB-133), 4,4'-bis(4-aminophenoxy)biphenyl (BAPB), 4,4'-diaminobenzanilide (DABA), methylene bis(anthranilic acid) (MBAA), 1,3'-bis (4-aminophenoxy)-2,2-dimethylpropane (DANPG), 1,5-bis (4-aminophenoxy)pentane (DA5MG), 2,2'-bis[4-(4-aminophenoxy pehnyl)]hexafluoropropane (HFBAPP), 2,2-bis(4-aminophenyl) hexafluoropropane (Bis-A-AF), 2,2-bis(3-amino-4-hydroxyphenyl) hexafluoropropane (Bis-AP-AF), 2,2-bis(3-amino-4-methylphenyl) hexafluoropropane (Bis-AT-AF), 4,4'-(perfluoropropane-2,2-diyl)dianiline, 4,4'-bis (4-amino-2-trifluoromethyl phenoxy)biphenyl (6BFBAPB), 3,3'5,5'-tetramethyl-4,4'-diamino diphenylmethane (TM-MDA), and the like and combinations thereof.

In some embodiments of Formula I, $R^b$ represents a diamine residue having Formula II and at least one additional diamine residue, where the additional aromatic diamine is selected from the group consisting of PPD, TFMB, ODA, 4,4'-(perfluoropropane-2,2-diyl)dianiline, and FDA.

Any of the above embodiments for Formula II in Formula I can be combined with one or more of the other embodiments, so long as they are not mutually exclusive.

In some embodiments of Formula I, moieties resulting from monoanhydride monomers are present as end-capping groups.

In some embodiments, the monoanhydride monomers are selected from the group consisting of phthalic anhydrides and the like and derivatives thereof.

In some embodiments, the monoanhydrides are present at an amount up to 5 mol % of the total tetracarboxylic acid composition.

In some embodiments of Formula I, moieties resulting from monoamine monomers are present as end-capping groups.

In some embodiments, the monoamine monomers are selected from the group consisting of aniline and the like and derivatives thereof.

In some embodiments, the monoamines are present at an amount up to 5 mol % of the total amine composition.

In some embodiments, the polyamic acid has a weight average molecular weight ($M_w$) greater than 100,000 based on gel permeation chromatography with polystyrene standards.

In some embodiments, the polyamic acid has a weight average molecular weight ($M_w$) greater than 150,000 based on gel permeation chromatography with polystyrene standards.

In some embodiments, the polyamic acid has a molecular weight ($M_w$) greater than 200,000 based on gel permeation chromatography with polystyrene standards.

In some embodiments, the polyamic acid has a weight average molecular weight ($M_w$) greater than 250,000 based on gel permeation chromatography with polystyrene standards.

In some embodiments, the polyamic acid has a weight average molecular weight ($M_w$) greater than 300,000 based on gel permeation chromatography with polystyrene standards.

In some embodiments, the polyamic acid has a weight average molecular weight ($M_w$) between 100,000 and 400,000 based on gel permeation chromatography with polystyrene standards.

In some embodiments, the polyamic acid has a weight average molecular weight ($M_w$) between 200,000 and 400,000 based on gel permeation chromatography with polystyrene standards.

In some embodiments, the polyamic acid has a weight average molecular weight ($M_w$) between 250,000 and 350,000 based on gel permeation chromatography with polystyrene standards.

In some embodiments, the polyamic acid has a weight average molecular weight ($M_w$) between 200,000 and 300,000 based on gel permeation chromatography with polystyrene standards.

Any of the above embodiments for the polyamic acid can be combined with one or more of the other embodiments, so long as they are not mutually exclusive.

Overall polyamic acid compositions can be designated via the notation commonly used in the art. For example, a polyamic acid having a tetracarboxylic acid component that is 100% ODPA, and a diamine component that is 90 mol % Bis-P and 10 mol % TFMB, would be represented as:

ODPA//Bis-P/22TFMB 100//90/10.

There is also provided a liquid composition comprising (a) the polyamic acid having a repeat unit of Formula II, and (b) a high-boiling aprotic solvent. The liquid composition is also referred to herein as the "polyamic acid solution".

In some embodiments, the high-boiling aprotic solvent has a boiling point of 150° C. or higher.

In some embodiments, the high-boiling aprotic solvent has a boiling point of 175° C. or higher.

In some embodiments, the high-boiling aprotic solvent has a boiling point of 200° C. or higher.

In some embodiments, the high-boiling aprotic solvent is a polar solvent. In some embodiments, the solvent has a dielectric constant greater than 20.

Some examples of high-boiling aprotic solvents include, but are not limited to, N-methyl-2-pyrrolidone (NMP), dimethyl acetamide (DMAc), dimethyl sulfoxide (DMSO), dimethyl formamide (DMF), γ-butyrolactone, dibutyl carbitol, butyl carbitol acetate, diethylene glycol monoethyl ether acetate, propylene glycol monoethyl ether acetate and the like, and combinations thereof.

In some embodiments of the liquid composition, the solvent is selected from the group consisting of NMP, DMAc, and DMF.

In some embodiments of the liquid composition, the solvent is NMP.

In some embodiments of the liquid composition, the solvent is DMAc.

In some embodiments of the liquid composition, the solvent is DMF.

In some embodiments of the liquid composition, the solvent is γ-butyrolactone.

In some embodiments of the liquid composition, the solvent is dibutyl carbitol.

In some embodiments of the liquid composition, the solvent is butyl carbitol acetate.

In some embodiments of the liquid composition, the solvent is diethylene glycol monoethyl ether acetate.

In some embodiments of the liquid composition, the solvent is propylene glycol monoethyl ether acetate.

In some embodiments, more than one of the high-boiling aprotic solvents identified above is used in the liquid composition.

In some embodiments, additional cosolvents are used in the liquid composition.

In some embodiments, the liquid composition is <1 weight % polyamic acid in >99 weight % high-boiling aprotic solvent.

In some embodiments, the liquid composition is 1-5 weight % polyamic acid in 95-99 weight % high-boiling aprotic solvent.

In some embodiments, the liquid composition is 5-10 weight % polyamic acid in 90-95 weight % high-boiling aprotic solvent.

In some embodiments, the liquid composition is 10-15 weight % polyamic acid in 85-90 weight % high-boiling aprotic solvent.

In some embodiments, the liquid composition is 15-20 weight % polyamic acid in 80-85 weight % high-boiling aprotic solvent.

In some embodiments, the liquid composition is 20-25 weight % polyamic acid in 75-80 weight % high-boiling aprotic solvent.

In some embodiments, the liquid composition is 25-30 weight % polyamic acid in 70-75 weight % high-boiling aprotic solvent.

In some embodiments, the liquid composition is 30-35 weight % polyamic acid in 65-70 weight % high-boiling aprotic solvent.

In some embodiments, the liquid composition is 35-40 weight % polyamic acid in 60-65 weight % high-boiling aprotic solvent.

In some embodiments, the liquid composition is 40-45 weight % polyamic acid in 55-60 weight % high-boiling aprotic solvent.

In some embodiments, the liquid composition is 45-50 weight % polyamic acid in 50-55 weight % high-boiling aprotic solvent.

In some embodiments, the liquid composition is 50 weight % polyamic acid in 50 weight % high-boiling aprotic solvent.

The polyamic acid solutions can optionally further contain any one of a number of additives. Such additives can be: antioxidants, heat stabilizers, adhesion promoters, coupling agents (e.g. silanes), inorganic fillers or various reinforcing agents so long as they don't adversely impact the desired polyimide properties.

The polyamic acid solutions can be prepared using a variety of available methods with respect to the introduction of the components (i.e., the monomers and solvents). Some methods of producing a polyamic acid solution include:

(a) a method wherein the polyamine components and polyanhydride components are preliminarily mixed together and then the mixture is added in portions to a solvent while stirring.

(b) a method wherein a solvent is added to a stirring mixture of polyamine and polyanhydride components. (contrary to (a) above)

(c) a method wherein polyamines are exclusively dissolved in a solvent and then polyanhydrides are added thereto at such a ratio as allowing to control the reaction rate.

(d) a method wherein the polyanhydride components are exclusively dissolved in a solvent and then amine components are added thereto at such a ratio to allow control of the reaction rate.

(e) a method wherein the components and the polyanhydride components are separately dissolved in solvents and then these solutions are mixed in a reactor.

(f) a method wherein the polyamic acid with excessive polyamine component and another polyamic acid with excessive polyanhydride component are preliminarily formed and then reacted with each other in a reactor, particularly in such a way as to create a non-random or block copolymer.

(g) a method wherein a specific portion of the polyamine components and the polyanhydride components are first reacted and then the residual polyamine components are reacted, or vice versa.

(h) a method wherein the components are added in part or in whole in any order to either part or whole of the solvent, also where part or all of any component can be added as a solution in part or all of the solvent.

(i) a method of first reacting one of the polyanhydride components with one of the polyamine components giving a first polyamic acid. Then reacting the other polyanhydride component with the other polyamine component to give a second polyamic acid. Then combining the polyamic acids in any one of a number of ways prior to film formation.

Generally speaking, a polyamic acid solution can be obtained from any one of the polyamic acid solution preparation methods disclosed above.

The polyamic acid solution can then be filtered one or more times in order to reduce the particle content. The polyimide film generated from such a filtered solution can show a reduced number of defects and thereby lead to superior performance in the electronics applications disclosed herein. An assessment of the filtration efficiency can be made by the laser particle counter test wherein a representative sample of the polyamic acid solution is cast onto a 5" silicon wafer. After soft baking/drying, the film is evaluated for particle content by any number of laser particle counting techniques on instruments that are commercially available and known in the art.

In some embodiments, the polyamic acid solution is prepared and filtered to yield a particle content of less than 40 particles as measured by the laser particle counter test.

In some embodiments, the polyamic acid solution is prepared and filtered to yield a particle content of less than 30 particles as measured by the laser particle counter test.

In some embodiments, the polyamic acid solution is prepared and filtered to yield a particle content of less than 20 particles as measured by the laser particle counter test.

In some embodiments, the polyamic acid solution is prepared and filtered to yield a particle content of less than 10 particles as measured by the laser particle counter test.

In some embodiments, the polyamic acid solution is prepared and filtered to yield particle content of between 2 particles and 8 particles as measured by the laser particle counter test.

In some embodiments, the polyamic acid solution is prepared and filtered to yield particle content of between 4 particles and 6 particles as measured by the laser particle counter test.

Exemplary preparations of polyamic acid solutions are given in the examples.

In some embodiments, the polyamic acid has a repeat unit structure of Formula IV

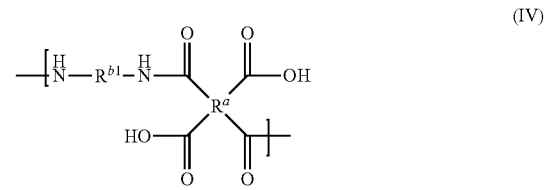

where:
$R^a$ represents one or more different tetracarboxylic acid component residues; and
$R^{b1}$ represents one or more different aromatic diamine residues or aromatic diisocyanate residues;
wherein 5-100 mol % of $R^{b1}$ has Formula V

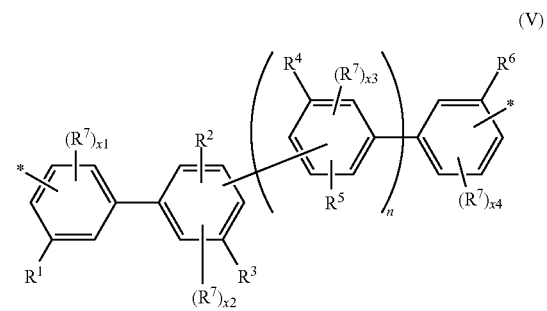

where $R^1$ through $R^7$, n, x1 through x4, and * are as defined above for Formula II.

All of the above-described embodiments for $R^a$ in Formula I, apply equally to $R^a$ in Formula IV.

In Formula IV, 5-100 mol % of $R^{b1}$ represents a diamine residue having Formula V, as shown above. In some embodiments of Formula IV, 10-100 mol % of $R^{b1}$ has Formula V; in some embodiments, 20-100 mol %; in some embodiments, 50-100 mol %; in some embodiments, 20-90 mol %; in some embodiments, 30-80 mol %; in some embodiments, 50-70 mol %; in some embodiments, 100 mol %.

In some embodiments of Formula V, n=0.
In some embodiments of Formula V, n=1.
In some embodiments of Formula V, n=2.
In some embodiments of Formula V, n=3.
In some embodiments of Formula V, n=4.
In some embodiments of Formula V, n=5.
In some embodiments of Formula V, n=6.
In some embodiments of Formula V, n=7.
In some embodiments of Formula V, n=8.
In some embodiments of Formula V, n=9.
In some embodiments of Formula V, n=10.
In some embodiments of Formula V, n=3-10.
In some embodiments of Formula V, n=4-7.

In some embodiments of Formula IV, 5-100 mol % of $R^{b1}$ represents a mixture of diamine oligomers having Formula IV with different numbers of monomer units.

In some embodiments of Formula I, $R^{b1}$ is deuterated. In some embodiments, $R^{b1}$ is at least 10% deuterated; in some embodiments, at least 30% deuterated; in some embodiments, at least 50% deuterated; in some embodiments, at least 70% deuterated; in some embodiments, at least 90% deuterated.

All of the above-described embodiments for $R^1$ through $R^7$, and x1 through x4 in Formula II, apply equally to $R^1$ through $R^7$, and x1 through x4 in Formula V.

In some embodiments of Formula IV, 5-100 mol % of $R^{b1}$ has Formula VA

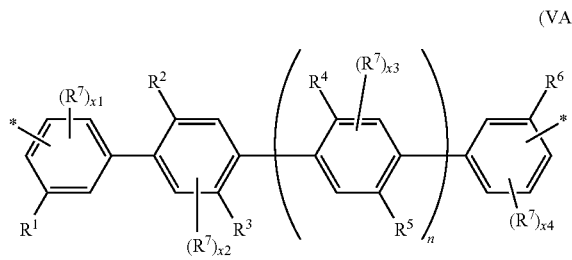

(VA)

where $R^1$ through $R^7$, n, x1 through x4, and * are as defined above in Formula V. All of the above-described embodiments for $R^1$ through $R^7$, n, and x1 through x4 in Formula V, apply equally to $R^1$ through $R^7$, n, and x1 through x4 in Formula VA.

In some embodiments of Formula IV, 5-100 mol % of $R^{b1}$ has Formula VA-1

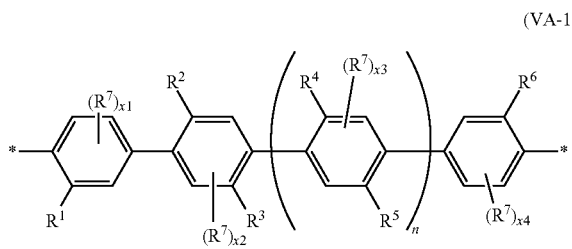

(VA-1)

where $R^1$ through $R^7$, n, x1 through x4, and * are as defined above in Formula V. All of the above-described embodiments for $R^1$ through $R^7$, n, and x1 through x4 in Formula V, apply equally to $R^1$ through $R^7$, n, and x1 through x4 in Formula VA-1.

In some embodiments of Formula IV, 5-100 mol % of $R^{b1}$ has Formula VA-2

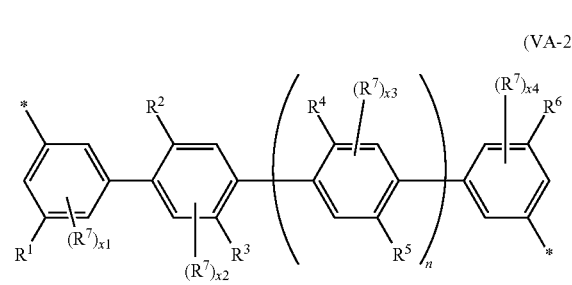

(VA-2)

where $R^1$ through $R^7$, n, x1 through x4, and * are as defined above in Formula V. All of the above-described embodiments for $R^1$ through $R^7$, n, and x1 through x4 in Formula V, apply equally to $R^1$ through $R^7$, n, and x1 through x4 in Formula VA-2.

In some embodiments of Formula IV, 5-100 mol % of $R^{b1}$ has Formula VB

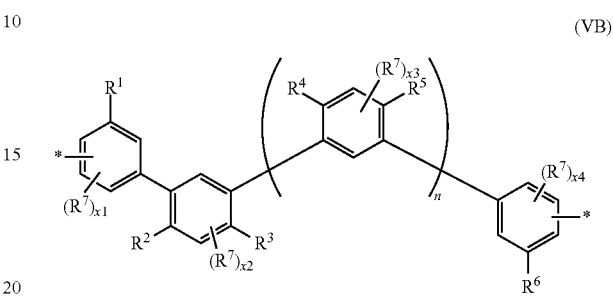

(VB)

where $R^1$ through $R^7$, n, x1 through x4, and * are as defined above in Formula V. All of the above-described embodiments for $R^1$ through $R^7$, n, and x1 through x4 in Formula V, apply equally to $R^1$ through $R^7$, n, and x1 through x4 in Formula VB.

In some embodiments of Formula IV, 5-100 mol % of $R^b$ has Formula VB-1

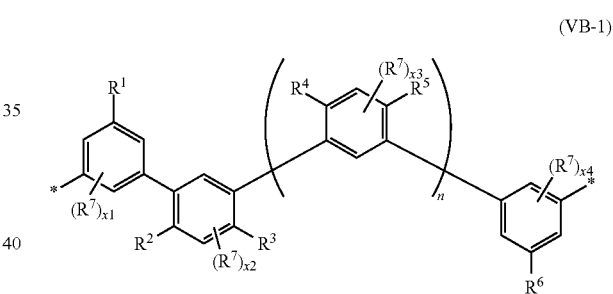

(VB-1)

where $R^1$ through $R^7$, n, x1 through x4, and * are as defined above in Formula V. All of the above-described embodiments for $R^1$ through $R^7$, n, and x1 through x4 in Formula V, apply equally to $R^1$ through $R^7$, n, and x1 through x4 in Formula VB-1.

In some embodiments of Formula IV, 5-100 mol % of $R^b$ has Formula VB-2

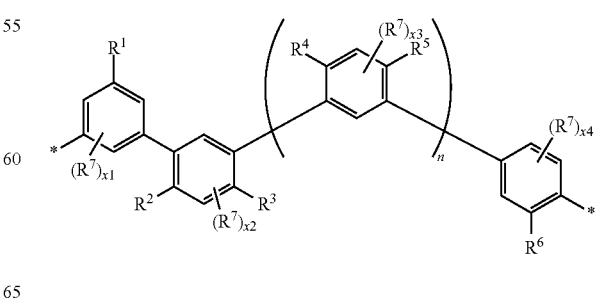

(VB-2)

where $R^1$ through $R^7$, n, x1 through x4, and * are as defined above in Formula V. All of the above-described embodiments for $R^1$ through $R^7$, n, and x1 through x4 in Formula V, apply equally to $R^1$ through $R^7$, n, and x1 through x4 in Formula VB-2.

Any of the above embodiments for Formula IV and any of the variables therein can be combined with one or more of the other embodiments, so long as they are not mutually exclusive.

In some embodiments of Formula IV, $R^{b1}$ represents a residue from a diamine selected from the group consisting of Compound V-1 through V-10, shown below.

In some embodiments of Formula IV, $R^{b1}$ represents a residue from a diamine selected from the group consisting of deuterated analogs of Compounds V-1 through V-10. In some embodiments, the diamine is at least 20% deuterated; in some embodiments, at least 50% deuterated; in some embodiments, at least 75% deuterated.

The above diamines can be made using any known technique, as described above.

In some embodiments of Formula IV, 5-100 mol % of $R^{b1}$ represents a diamine residue having Formula V, as shown above.

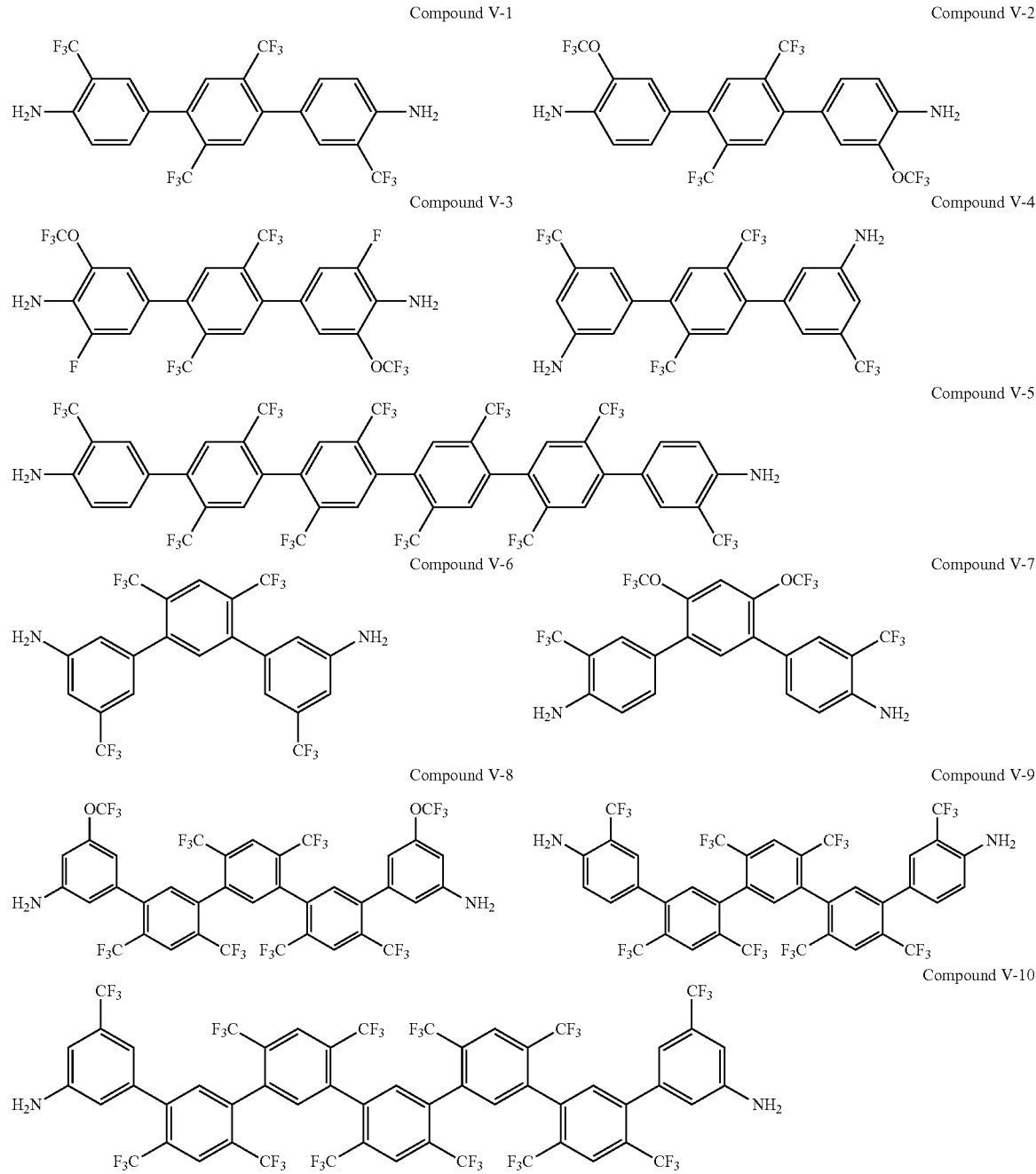

In some embodiments of Formula IV, 5-100 mol % of $R^{b1}$ represents a diamine residue from two or more different diamines each of which has Formula V, as shown above.

In some embodiments of Formula IV, $R^{b1}$ represents a diamine residue having Formula V and at least one additional diamine residue.

In some embodiments of Formula IV, $R^{b1}$ represents a diamine residue having Formula V and one additional diamine residue.

In some embodiments of Formula IV, $R^{b1}$ represents a diamine residue having Formula V and two additional diamine residues.

In some embodiments of Formula IV, $R^{b1}$ represents a diamine residue having Formula V and three additional diamine residues.

3. Polyimide

There is provided a polyimide resulting from imidization of the above-described polyamic acid. By "imidization" is meant intramolecular cyclization of the amic acid groups to form imide groups. In some embodiments, thermal imidization is used. In some embodiments, chemical imidization is used. In some embodiments, a combination of thermal and chemical imidization is used.

In some embodiments, the polyimide has a repeat unit structure of Formula III

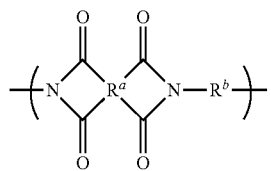

(III)

where
$R^a$ is the same or different at each occurrence and represents one or more tetracarboxylic acid component residues; and
$R^b$ is the same or different at each occurrence and represents one or more aromatic diamine residues;
wherein 5-100 mol % of $R^b$ has Formula II, as described above.

All of the above-described embodiments for $R^a$ and $R^b$ in Formula I apply equally to $R^a$ and $R^b$ in Formula III.

All of the above-described embodiments for Formula II in Formula I, apply equally to Formula II in Formula III.

In some embodiments, the polyimide has a repeat unit structure of Formula VI

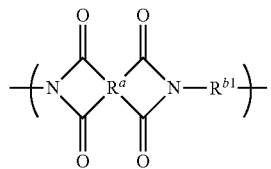

(VI)

where
$R^a$ is the same or different at each occurrence and represents one or more tetracarboxylic acid component residues; and
$R^{b1}$ is the same or different at each occurrence and represents one or more aromatic diamine residues;
wherein 5-100 mol % of $R^{b1}$ has Formula V, as described above.

All of the above-described embodiments for $R^a$ and $R^{b1}$ in Formula IV apply equally to $R^a$ and $R^{b1}$ in Formula VI.

All of the above-described embodiments for Formula V in Formula IV, apply equally to Formula V in Formula VI.

Polyimides can be made from any suitable polyimide precursor such as a polyamic acid, a polyamic acid ester, a polyisoimide, and a polyamic acid salt.

There is also provided a polyimide film, wherein the polyimide has a repeat unit structure of Formula III or Formula VI, as described above.

Polyimide films can be made by coating a polyimide precursor onto a substrate and subsequently imidizing. This can be accomplished by a thermal conversion process or a chemical conversion process.

Further, if the polyimide is soluble in suitable coating solvents, it can be provided as an already-imidized polymer dissolved in the suitable coating solvent and coated as the polyimide.

In some embodiments, the polyimide film having repeat units of Formula III has both a high glass transition temperature ("$T_g$") and a low b* color value.

In some embodiments, the polyimide film having repeat units of Formula VI has both a high glass transition temperature ("$T_g$") and a low b* color value.

In some embodiments of the polyimide film, the $T_g$ is greater than 400° C. for a 10 µm polyimide film cured at a temperature above 350° C.; in some embodiments, the $T_g$ is greater than 430° C.; in some embodiments, the $T_g$ is greater than 450° C.

In some embodiments of the polyimide film, the b* is less than 10.0, in some embodiments, less than 5.0; in some embodiments, less than 3.0.

In some embodiments of the polyimide film, the YI is less than 12; in some embodiments, less than 10.

In some embodiments of the polyimide film, the optical retardation (Rth) is less than 1000 at 550 nm; in some embodiments, less than 500.

In some embodiments of the polyimide film, the in-plane coefficient of thermal expansion (CTE) is less than 45 ppm/° C. between 50° C. and 200° C., for the first measurement; in some embodiments, less than 30 ppm/° C.; in some embodiments, less than 20 ppm/° C.; in some embodiments, less than 15 ppm/° C.

In some embodiments of the polyimide film, the in-plane coefficient of thermal expansion (CTE) is less than 75 ppm/° C. between 50° C. and 200° C., for the second measurement; in some embodiments, less than 65 ppm/° C.

In some embodiments of the polyimide film, the 1% TGA weight loss temperature is greater than 350° C.; in some embodiments, greater than 400° C.; in some embodiments, greater than 450° C.

In some embodiments of the polyimide film, the tensile modulus is between 1.5 GPa and 15.0 GPa; in some embodiments, between 1.5 GPa and 10.0 GPa; in some embodiments, between 1.5 and 7.5 GPa; in some embodiments, between 1.5 and 5.0 GPa.

In some embodiments of the polyimide film, the elongation to break is greater than 10%.

In some embodiments of the polyimide film, the haze is less than 1.0%; in some embodiments less than 0.5%.

In some embodiments of the polyimide film, the transmittance at 400 nm is greater than 40%; in some embodiments, greater than 50%.

In some embodiments of the polyimide film, the transmittance at 430 nm is greater than 60%; in some embodiments, greater than 70%. In some embodiments of the polyimide film, the transmittance at 450 nm is greater than 70%; in some embodiments, greater than 80%.

In some embodiments of the polyimide film, the transmittance at 550 nm is greater than 70%; in some embodiments, greater than 80%.

In some embodiments of the polyimide film, the transmittance at 750 nm is greater than 70%; in some embodiments, greater than 80%.

Any of the above embodiments for the polyimide film can be combined with one or more of the other embodiments, so long as they are not mutually exclusive.

4. Methods for Preparing the Polyimide Films

Generally, polyimide films can be prepared from polyimide precursors by chemical or thermal conversion. In some embodiments, the films are prepared from the corresponding polyamic acid solutions by chemical or thermal conversion processes. The polyimide films disclosed herein, particularly when used as flexible replacements for glass in electronic devices, are prepared by thermal conversion processes.

Generally, polyimide films can be prepared from the corresponding polyamic acid solutions by chemical or thermal conversion processes. The polyimide films disclosed herein, particularly when used as flexible replacements for glass in electronic devices, are prepared by thermal conversion or modified-thermal conversion processes, versus chemical conversion processes.

Chemical conversion processes are described in U.S. Pat. Nos. 5,166,308 and 5,298,331 which are incorporated by reference in their entirety. In such processes, conversion chemicals are added to the polyamic acid solutions. The conversion chemicals found to be useful in the present invention include, but are not limited to, (i) one or more dehydrating agents, such as, aliphatic acid anhydrides (acetic anhydride, etc.) and acid anhydrides; and (ii) one or more catalysts, such as, aliphatic tertiary amines (triethylamine, etc.), tertiary amines (dimethylaniline, etc.) and heterocyclic tertiary amines (pyridine, picoline, isoquinoilne, etc.). The anhydride dehydrating material is typically used in a slight molar excess of the amount of amide acid groups present in the polyamic acid solution. The amount of acetic anhydride used is typically about 2.0-3.0 moles per equivalent of the polyamic acid. Generally, a comparable amount of tertiary amine catalyst is used.

Thermal conversion processes may or may not employ conversion chemicals (i.e., catalysts) to convert a polyamic acid casting solution to a polyimide. If conversion chemicals are used, the process may be considered a modified-thermal conversion process. In both types of thermal conversion processes, only heat energy is used to heat the film to both dry the film of solvent and to perform the imidization reaction. Thermal conversion processes with or without conversion catalysts are generally used to prepare the polyimide films disclosed herein.

Specific method parameters are pre-selected considering that it is not just the film composition that yields the properties of interest. Rather, the cure temperature and temperature-ramp profile also play important roles in the achievement of the most desirable properties for the intended uses disclosed herein. The polyamic acids should be imidized at a temperature at, or higher than, the highest temperature of any subsequent processing steps (e.g. deposition of inorganic or other layer(s) necessary to produce a functioning display), but at a temperature which is lower than the temperature at which significant thermal degradation/discoloration of the polyimide occurs. It should also be noted that an inert atmosphere is generally preferred, particularly when higher processing temperatures are employed for imidization.

For the polyamic acids/polyimides disclosed herein, temperatures of 300° C. to 320° C. are typically employed when subsequent processing temperatures in excess of 300° C. are required. Choosing the proper curing temperature allows a fully cured polyimide which achieves the best balance of thermal and mechanical properties. Because of this very high temperature, an inert atmosphere is required. Typically, oxygen levels in the oven of <100 ppm should be employed. Very low oxygen levels enable the highest curing temperatures to be used without significant degradation/discoloration of the polymer. Catalysts that accelerate the imidization process are effective at achieving higher levels of imidization at cure temperatures between about 200° C. and 300° C. This approach may be optionally employed if the flexible device is prepared with upper cure temperatures that are below the $T_g$ of the polyimide.

The amount of time in each potential cure step is also an important process consideration. Generally, the time used for the highest-temperature curing should be kept to a minimum. For 320° C. cure, for example, cure time can be up to an hour or so under an inert atmosphere, but at higher cure temperatures, this time should be shortened to avoid thermal degradation. Generally speaking, higher temperature dictates shorter time. Those skilled in the art will recognize the balance between temperature and time in order to optimize the properties of the polyimide for a particular end use.

In some embodiments, the polyamic acid solution is converted into a polyimide film via a thermal conversion process.

In some embodiments of the thermal conversion process, the polyamic acid solution is coated onto the matrix such that the soft-baked thickness of the resulting film is less than 50 μm.

In some embodiments of the thermal conversion process, the polyamic acid solution is coated onto the matrix such that the soft-baked thickness of the resulting film is less than 40 μm.

In some embodiments of the thermal conversion process, the polyamic acid solution is coated onto the matrix such that the soft-baked thickness of the resulting film is less than 30 μm.

In some embodiments of the thermal conversion process, the polyamic acid solution is coated onto the matrix such that the soft-baked thickness of the resulting film is less than 20 μm.

In some embodiments of the thermal conversion process, the polyamic acid solution is coated onto the matrix such that the soft-baked thickness of the resulting film is between 10 μm and 20 μm.

In some embodiments of the thermal conversion process, the polyamic acid solution is coated onto the matrix such that the soft-baked thickness of the resulting film is between 15 μm and 20 μm.

In some embodiments of the thermal conversion process, the polyamic acid solution is coated onto the matrix such that the soft-baked thickness of the resulting film is 18 μm.

In some embodiments of the thermal conversion process, the polyamic acid solution is coated onto the matrix such that the soft-baked thickness of the resulting film is less than 10 μm.

In some embodiments of the thermal conversion process, the coated matrix is soft baked on a hot plate in proximity mode wherein nitrogen gas is used to hold the coated matrix just above the hot plate.

In some embodiments of the thermal conversion process, the coated matrix is soft baked on a hot plate in full-contact mode wherein the coated matrix is in direct contact with the hot plate surface.

In some embodiments of the thermal conversion process, the coated matrix is soft baked on a hot plate using a combination of proximity and full-contact modes.

In some embodiments of the thermal conversion process, the coated matrix is soft-baked using a hot plate set at 80° C.

In some embodiments of the thermal conversion process, the coated matrix is soft-baked using a hot plate set at 90° C.

In some embodiments of the thermal conversion process, the coated matrix is soft-baked using a hot plate set at 100° C.

In some embodiments of the thermal conversion process, the coated matrix is soft-baked using a hot plate set at 110° C.

In some embodiments of the thermal conversion process, the coated matrix is soft-baked using a hot plate set at 120° C.

In some embodiments of the thermal conversion process, the coated matrix is soft-baked using a hot plate set at 130° C.

In some embodiments of the thermal conversion process, the coated matrix is soft-baked using a hot plate set at 140° C.

In some embodiments of the thermal conversion process, the coated matrix is soft-baked for a total time of more than 10 minutes.

In some embodiments of the thermal conversion process, the coated matrix is soft-baked for a total time of less than 10 minutes.

In some embodiments of the thermal conversion process, the coated matrix is soft-baked for a total time of less than 8 minutes.

In some embodiments of the thermal conversion process, the coated matrix is soft-baked for a total time of less than 6 minutes.

In some embodiments of the thermal conversion process, the coated matrix is soft-baked for a total time of 4 minutes.

In some embodiments of the thermal conversion process, the coated matrix is soft-baked for a total time of less than 4 minutes.

In some embodiments of the thermal conversion process, the coated matrix is soft-baked for a total time of less than 2 minutes.

In some embodiments of the thermal conversion process, the soft-baked coated matrix is subsequently cured at 2 pre-selected temperatures for 2 pre-selected time intervals, the latter of which may be the same or different.

In some embodiments of the thermal conversion process, the soft-baked coated matrix is subsequently cured at 3 pre-selected temperatures for 3 pre-selected time intervals, each of which of the latter of which may be the same or different.

In some embodiments of the thermal conversion process, the soft-baked coated matrix is subsequently cured at 4 pre-selected temperatures for 4 pre-selected time intervals, each of which of the latter of which may be the same or different.

In some embodiments of the thermal conversion process, the soft-baked coated matrix is subsequently cured at 5 pre-selected temperatures for 5 pre-selected time intervals, each of which of the latter of which may be the same or different.

In some embodiments of the thermal conversion process, the soft-baked coated matrix is subsequently cured at 6 pre-selected temperatures for 6 pre-selected time intervals, each of which of the latter of which may be the same or different.

In some embodiments of the thermal conversion process, the soft-baked coated matrix is subsequently cured at 7 pre-selected temperatures for 7 pre-selected time intervals, each of which of the latter of which may be the same or different.

In some embodiments of the thermal conversion process the soft-baked coated matrix is subsequently cured at 8 pre-selected temperatures for 8 pre-selected time intervals, each of which of the latter of which may be the same or different.

In some embodiments of the thermal conversion process, the soft-baked coated matrix is subsequently cured at 9 pre-selected temperatures for 9 pre-selected time intervals, each of which of the latter of which may be the same or different.

In some embodiments of the thermal conversion process, the soft-baked coated matrix is subsequently cured at 10 pre-selected temperatures for 10 pre-selected time intervals, each of which of the latter of which may be the same or different.

In some embodiments of the thermal conversion process, the pre-selected temperature is greater than 80° C.

In some embodiments of the thermal conversion process, the pre-selected temperature is equal to 100° C.

In some embodiments of the thermal conversion process, the pre-selected temperature is greater than 100° C.

In some embodiments of the thermal conversion process, the pre-selected temperature is equal to 150° C.

In some embodiments of the thermal conversion process, the pre-selected temperature is greater than 150° C.

In some embodiments of the thermal conversion process, the pre-selected temperature is equal to 200° C.

In some embodiments of the thermal conversion process, the pre-selected temperature is greater than 200° C.

In some embodiments of the thermal conversion process, the pre-selected temperature is equal to 250° C.

In some embodiments of the thermal conversion process, the pre-selected temperature is greater than 250° C.

In some embodiments of the thermal conversion process, the pre-selected temperature is equal to 300° C.

In some embodiments of the thermal conversion process, the pre-selected temperature is greater than 300° C.

In some embodiments of the thermal conversion process, the pre-selected temperature is equal to 350° C.

In some embodiments of the thermal conversion process, the pre-selected temperature is greater than 350° C.

In some embodiments of the thermal conversion process, the pre-selected temperature is equal to 400° C.

In some embodiments of the thermal conversion process, the pre-selected temperature is greater than 400° C.

In some embodiments of the thermal conversion process, the pre-selected temperature is equal to 450° C.

In some embodiments of the thermal conversion process, the pre-selected temperature is greater than 450° C.

In some embodiments of the thermal conversion process, the pre-selected temperature is equal to 500° C.

In some embodiments of the thermal conversion process, the pre-selected temperature is greater than 500° C.

In some embodiments of the thermal conversion process, one or more of the pre-selected time intervals is 2 minutes.

In some embodiments of the thermal conversion process, one or more of the pre-selected time intervals is 5 minutes.

In some embodiments of the thermal conversion process, one or more of the pre-selected time intervals is 10 minutes.

In some embodiments of the thermal conversion process, one or more of the pre-selected time intervals is 15 minutes.

In some embodiments of the thermal conversion process, one or more of the pre-selected time intervals is 20 minutes.

In some embodiments of the thermal conversion process, one or more of the pre-selected time intervals is 25 minutes.

In some embodiments of the thermal conversion process, one or more of the pre-selected time intervals is 30 minutes.

In some embodiments of the thermal conversion process, one or more of the pre-selected time intervals is 35 minutes.

In some embodiments of the thermal conversion process, one or more of the pre-selected time intervals is 40 minutes.

In some embodiments of the thermal conversion process, one or more of the pre-selected time intervals is 45 minutes.

In some of the thermal conversion process, one or more of the pre-selected time intervals is 50 minutes.

In some embodiments of the thermal conversion process, one or more of the pre-selected time intervals is 55 minutes.

In some embodiments of the thermal conversion process, one or more of the pre-selected time intervals is 60 minutes.

In some embodiments of the thermal conversion process, one or more of the pre-selected time intervals is greater than 60 minutes.

In some embodiments of the thermal conversion process, one or more of the pre-selected time intervals is between 2 minutes and 60 minutes.

In some embodiments of the thermal conversion process, one or more of the pre-selected time intervals is between 2 minutes and 90 minutes.

In some embodiments of the thermal conversion process, one or more of the pre-selected time intervals is between 2 minutes and 120 minutes.

In some embodiments of the thermal conversion process, the method for preparing a polyimide film comprises the following steps in order: coating the above-described polyamic acid solution onto a matrix; soft-baking the coated matrix; treating the soft-baked coated matrix at a plurality of pre-selected temperatures for a plurality of pre-selected time intervals whereby the polyimide film exhibits properties that are satisfactory for use in electronics applications like those disclosed herein.

In some embodiments of the thermal conversion process, the method for preparing a polyimide film consists of the following steps in order: coating the above-described polyamic acid solution onto a matrix; soft-baking the coated matrix; treating the soft-baked coated matrix at a plurality of pre-selected temperatures for a plurality of pre-selected time intervals whereby the polyimide film exhibits properties that are satisfactory for use in electronics applications like those disclosed herein.

In some embodiments of the thermal conversion process, the method for preparing a polyimide film consists essentially of the following steps in order: coating the above-described polyamic acid solution onto a matrix; soft-baking the coated matrix; treating the soft-baked coated matrix at a plurality of pre-selected temperatures for a plurality of pre-selected time intervals whereby the polyimide film exhibits properties that are satisfactory for use in electronics applications like those disclosed herein.

Typically, the polyamic acid solutions/polyimides disclosed herein are coated/cured onto a supporting glass substrate to facilitate the processing through the rest of the display making process. At some point in the process as determined by the display maker, the polyimide coating is removed from the supporting glass substrate by a mechanical or laser lift off process. These processes separate the polyimide as a film with the deposited display layers from the glass and enable a flexible format. Often, this polyimide film with deposition layers is then bonded to a thicker, but still flexible, plastic film to provide support for subsequent fabrication of the display.

There are also provided modified-thermal conversion processes wherein conversion catalysts generally cause imidization reactions to run at lower temperatures than would be possible in the absence of such conversion catalysts.

In some embodiments, the polyamic acid solution is converted into a polyimide film via a modified-thermal conversion process.

In some embodiments of the modified-thermal conversion process, the polyamic acid solution further contains conversion catalysts.

In some embodiments of the modified-thermal conversion process, the polyamic acid solution further contains conversion catalysts selected from the group consisting of tertiary amines.

In some embodiments of the modified-thermal conversion process, the polyamic acid solution further contains conversion catalysts selected from the group consisting of tributylamine, dimethylethanolamine, isoquinoline, 1,2-dimethylimidazole, N-methylimidazole, 2-methylimidazole, 2-ethyl-4-imidazole, 3,5-dimethylpyridine, 3,4-dimethylpyridine, 2,5-dimethylpyridine, 5-methylbenzimidazole, and the like.

In some embodiments of the modified-thermal conversion process, the conversion catalyst is present at 5 weight percent or less of the polyamic acid solution.

In some embodiments of the modified-thermal conversion process, the conversion catalyst is present at 3 weight percent or less of the polyamic acid solution.

In some embodiments of the modified-thermal conversion process, the conversion catalyst is present at 1 weight percent or less of the polyamic acid solution.

In some embodiments of the modified-thermal conversion process, the conversion catalyst is present at 1 weight percent of the polyamic acid solution.

In some embodiments of the modified-thermal conversion process, the polyamic acid solution further contains tributylamine as a conversion catalyst.

In some embodiments of the modified-thermal conversion process, the polyamic acid solution further contains dimethylethanolamine as a conversion catalyst.

In some embodiments of the modified-thermal conversion process, the polyamic acid solution further contains isoquinoline as a conversion catalyst.

In some embodiments of the modified-thermal conversion process, the polyamic acid solution further contains 1,2-dimethylimidazole as a conversion catalyst.

In some embodiments of the modified-thermal conversion process, the polyamic acid solution further contains 3,5-dimethylpyridine as a conversion catalyst.

In some embodiments of the modified-thermal conversion process, the polyamic acid solution further contains 5-methylbenzimidazole as a conversion catalyst.

In some embodiments of the modified-thermal conversion process, the polyamic acid solution further contains N-methylimidazole as a conversion catalyst.

In some embodiments of the modified-thermal conversion process, the polyamic acid solution further contains 2-methylimidazole as a conversion catalyst.

In some embodiments of the modified-thermal conversion process, the polyamic acid solution further contains 2-ethyl-4-imidazole as a conversion catalyst.

In some embodiments of the modified-thermal conversion process, the polyamic acid solution further contains 3,4-dimethylpyridine as a conversion catalyst.

In some embodiments of the modified-thermal conversion process, the polyamic acid solution further contains 2,5-dimethylpyridine as a conversion catalyst.

In some embodiments of the modified-thermal conversion process, the polyamic acid solution is coated onto the matrix such that the soft-baked thickness of the resulting film is less than 50 μm.

In some embodiments of the modified-thermal conversion process, the polyamic acid solution is coated onto the matrix such that the soft-baked thickness of the resulting film is less than 40 μm.

In some embodiments of the modified-thermal conversion process, the polyamic acid solution is coated onto the matrix such that the soft-baked thickness of the resulting film is less than 30 μm.

In some embodiments of the modified-thermal conversion process, the polyamic acid solution is coated onto the matrix such that the soft-baked thickness of the resulting film is less than 20 μm.

In some embodiments of the modified-thermal conversion process, the polyamic acid solution is coated onto the matrix such that the soft-baked thickness of the resulting film is between 10 μm and 20 μm.

In some embodiments of the modified-thermal conversion process, the polyamic acid solution is coated onto the matrix such that the soft-baked thickness of the resulting film is between 15 μm and 20 μm.

In some embodiments of the modified-thermal conversion process, the polyamic acid solution is coated onto the matrix such that the soft-baked thickness of the resulting film is 18 μm.

In some embodiments of the modified-thermal conversion process, the polyamic acid solution is coated onto the matrix such that the soft-baked thickness of the resulting film is less than 10 μm.

In some embodiments of the modified-thermal conversion process, the coated matrix is soft baked on a hot plate in proximity mode wherein nitrogen gas is used to hold the coated matrix just above the hot plate.

In some embodiments of the modified-thermal conversion process, the coated matrix is soft baked on a hot plate in full-contact mode wherein the coated matrix is in direct contact with the hot plate surface.

In some embodiments of the modified-thermal conversion process, the coated matrix is soft baked on a hot plate using a combination of proximity and full-contact modes.

In some embodiments of the modified-thermal conversion process, the coated matrix is soft-baked using a hot plate set at 80° C.

In some embodiments of the modified-thermal conversion process, the coated matrix is soft-baked using a hot plate set at 90° C.

In some embodiments of the modified-thermal conversion process, the coated matrix is soft-baked using a hot plate set at 100° C.

In some embodiments of the modified-thermal conversion process, the coated matrix is soft-baked using a hot plate set at 110° C.

In some embodiments of the modified-thermal conversion process, the coated matrix is soft-baked using a hot plate set at 120° C.

In some embodiments of the modified-thermal conversion process, the coated matrix is soft-baked using a hot plate set at 130° C.

In some embodiments of the modified-thermal conversion process, the coated matrix is soft-baked using a hot plate set at 140° C.

In some embodiments of the modified-thermal conversion process, the coated matrix is soft-baked for a total time of more than 10 minutes.

In some embodiments of the modified-thermal conversion process, the coated matrix is soft-baked for a total time of less than 10 minutes.

In some embodiments of the modified-thermal conversion process, the coated matrix is soft-baked for a total time of less than 8 minutes.

In some embodiments of the modified-thermal conversion process, the coated matrix is soft-baked for a total time of less than 6 minutes.

In some embodiments of the modified-thermal conversion process, the coated matrix is soft-baked for a total time of 4 minutes.

In some embodiments of the modified-thermal conversion process, the coated matrix is soft-baked for a total time of less than 4 minutes.

In some embodiments of the modified-thermal conversion process, the coated matrix is soft-baked for a total time of less than 2 minutes.

In some embodiments of the modified-thermal conversion process, the soft-baked coated matrix is subsequently cured at 2 pre-selected temperatures for 2 pre-selected time intervals, the latter of which may be the same or different.

In some embodiments of the modified-thermal conversion process, the soft-baked coated matrix is subsequently cured at 3 pre-selected temperatures for 3 pre-selected time intervals, each of which of the latter of which may be the same or different.

In some embodiments of the modified-thermal conversion process, the soft-baked coated matrix is subsequently cured at 4 pre-selected temperatures for 4 pre-selected time intervals, each of which of the latter of which may be the same or different.

In some embodiments of the modified-thermal conversion process, the soft-baked coated matrix is subsequently cured at 5 pre-selected temperatures for 5 pre-selected time intervals, each of which of the latter of which may be the same or different.

In some embodiments of the modified-thermal conversion process, the soft-baked coated matrix is subsequently cured at 6 pre-selected temperatures for 6 pre-selected time intervals, each of which of the latter of which may be the same or different.

In some embodiments of the modified-thermal conversion process, the soft-baked coated matrix is subsequently cured at 7 pre-selected temperatures for 7 pre-selected time intervals, each of which of the latter of which may be the same or different.

In some embodiments of the modified-thermal conversion process the soft-baked coated matrix is subsequently cured at 8 pre-selected temperatures for 8 pre-selected time intervals, each of which of the latter of which may be the same or different.

In some embodiments of the modified-thermal conversion process, the soft-baked coated matrix is subsequently cured at 9 pre-selected temperatures for 9 pre-selected time intervals, each of which of the latter of which may be the same or different.

In some embodiments of the modified-thermal conversion process, the soft-baked coated matrix is subsequently cured at 10 pre-selected temperatures for 10 pre-selected time intervals, each of which of the latter of which may be the same or different.

In some embodiments of the modified-thermal conversion process, the pre-selected temperature is greater than 80° C.

In some embodiments of the modified-thermal conversion process, the pre-selected temperature is equal to 100° C.

In some embodiments of the modified-thermal conversion process, the pre-selected temperature is greater than 100° C.

In some embodiments of the modified-thermal conversion process, the pre-selected temperature is equal to 150° C.

In some embodiments of the modified-thermal conversion process, the pre-selected temperature is greater than 150° C.

In some embodiments of the modified-thermal conversion process, the pre-selected temperature is equal to 200° C.

In some embodiments of the modified-thermal conversion process, the pre-selected temperature is greater than 200° C.

In some embodiments of the modified-thermal conversion process, the pre-selected temperature is equal to 220° C.

In some embodiments of the modified-thermal conversion process, the pre-selected temperature is greater than 220° C.

In some embodiments of the modified-thermal conversion process, the pre-selected temperature is equal to 230° C.

In some embodiments of the modified-thermal conversion process, the pre-selected temperature is greater than 230° C.

In some embodiments of the modified-thermal conversion process, the pre-selected temperature is equal to 240° C.

In some embodiments of the modified-thermal conversion process, the pre-selected temperature is greater than 240° C.

In some embodiments of the modified-thermal conversion process, the pre-selected temperature is equal to 250° C.

In some embodiments of the modified-thermal conversion process, the pre-selected temperature is greater than 250° C.

In some embodiments of the modified-thermal conversion process, the pre-selected temperature is equal to 260° C.

In some embodiments of the modified-thermal conversion process, the pre-selected temperature is greater than 260° C.

In some embodiments of the modified-thermal conversion process, the pre-selected temperature is equal to 270° C.

In some embodiments of the modified-thermal conversion process, the pre-selected temperature is greater than 270° C.

In some embodiments of the modified-thermal conversion process, the pre-selected temperature is equal to 280° C.

In some embodiments of the modified-thermal conversion process, the pre-selected temperature is greater than 280° C.

In some embodiments of the modified-thermal conversion process, the pre-selected temperature is equal to 290° C.

In some embodiments of the modified-thermal conversion process, the pre-selected temperature is greater than 290° C.

In some embodiments of the modified-thermal conversion process, the pre-selected temperature is equal to 300° C.

In some embodiments of the modified-thermal conversion process, the pre-selected temperature is less than 300° C.

In some embodiments of the modified-thermal conversion process, the pre-selected temperature is less than 290° C.

In some embodiments of the modified-thermal conversion process, the pre-selected temperature is less than 280° C.

In some embodiments of the modified-thermal conversion process, the pre-selected temperature is less than 270° C.

In some embodiments of the modified-thermal conversion process, the pre-selected temperature is less than 260° C.

In some embodiments of the modified-thermal conversion process, the pre-selected temperature is less than 250° C.

In some embodiments of the modified-thermal conversion process, one or more of the pre-selected time intervals is 2 minutes.

In some embodiments of the modified-thermal conversion process, one or more of the pre-selected time intervals is 5 minutes.

In some embodiments of the modified-thermal conversion process, one or more of the pre-selected time intervals is 10 minutes.

In some embodiments of the modified-conversion process, one or more of the pre-selected time intervals is 15 minutes.

In some embodiments of the modified-thermal conversion process, one or more of the pre-selected time intervals is 20 minutes.

In some embodiments of the modified-thermal conversion process, one or more of the pre-selected time intervals is 25 minutes.

In some embodiments of the modified-thermal conversion process, one or more of the pre-selected time intervals is 30 minutes.

In some embodiments of the modified-thermal conversion process, one or more of the pre-selected time intervals is 35 minutes.

In some embodiments of the modified-thermal conversion process, one or more of the pre-selected time intervals is 40 minutes.

In some embodiments of the modified-thermal conversion process, one or more of the pre-selected time intervals is 45 minutes.

In some embodiments of the modified-thermal conversion process, one or more of the pre-selected time intervals is 50 minutes.

In some embodiments of the modified-thermal conversion process, one or more of the pre-selected time intervals is 55 minutes.

In some embodiments of the modified-thermal conversion process, one or more of the pre-selected time intervals is 60 minutes.

In some embodiments of the modified-thermal conversion process, one or more of the pre-selected time intervals is greater than 60 minutes.

In some embodiments of the modified-thermal conversion process, one or more of the pre-selected time intervals is between 2 minutes and 60 minutes.

In some embodiments of the modified-thermal conversion process, one or more of the pre-selected time intervals is between 2 minutes and 90 minutes.

In some embodiments of the modified-thermal conversion process, one or more of the pre-selected time intervals is between 2 minutes and 120 minutes.

In some embodiments of the modified-thermal conversion process, the method for preparing a polyimide film comprises the following steps in order: coating the above-described polyamic acid solution including a conversion chemical onto a matrix; soft-baking the coated matrix; treating the soft-baked coated matrix at a plurality of pre-selected temperatures for a plurality of pre-selected time intervals whereby the polyimide film exhibits properties that are satisfactory for use in electronics applications like those disclosed herein.

In some embodiments of the modified-thermal conversion process, the method for preparing a polyimide film consists of the following steps in order: coating the above-described polyamic acid solution including a conversion chemical onto a matrix; soft-baking the coated matrix; treating the soft-baked coated matrix at a plurality of pre-selected temperatures for a plurality of pre-selected time intervals whereby the polyimide film exhibits properties that are satisfactory for use in electronics applications like those disclosed herein.

In some embodiments of the modified-thermal conversion process, the method for preparing a polyimide film consists essentially of the following steps in order: coating the above-described polyamic acid solution including a conversion chemical onto a matrix; soft-baking the coated matrix; treating the soft-baked coated matrix at a plurality of pre-selected temperatures for a plurality of pre-selected time intervals whereby the polyimide film exhibits properties that are satisfactory for use in electronics applications like those disclosed herein.

5. The Electronic Device

The polyimide films disclosed herein can be suitable for use in a number of layers in electronic display devices such as OLED and LCD Displays. Nonlimiting examples of such layers include device substrates, touch panels, substrates for color filter sheets, cover films, and others. The particular materials' properties requirements for each application are unique and may be addressed by appropriate composition(s) and processing condition(s) for the polyimide films disclosed herein.

In some embodiments, the flexible replacement for glass in an electronic device is a polyimide film having the repeat unit of Formula III, as described in detail above.

In some embodiments, there is provided an organic electronic device having at least one layer comprising a polyimide film having a repeat unit of Formula III, as described in detail above.

In some embodiments, there is provided an organic electronic device having at least one layer comprising a polyimide film having a repeat unit of Formula VI, as described in detail above.

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

Figure 2:
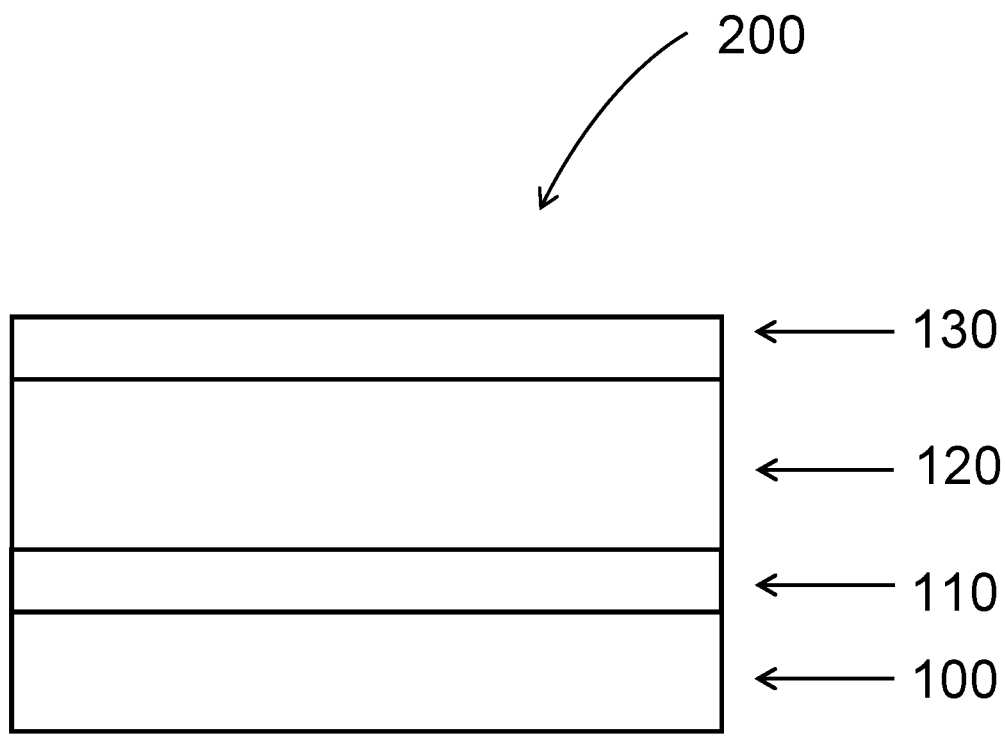
FIG. 2 includes an illustration of one example of an electronic device that includes a flexible replacement for glass.

One illustration of a polyimide film that can act as a flexible replacement for glass as described herein is shown in FIG. 1. The flexible film 100 can have the properties as described in the embodiments of this disclosure. In some embodiments, the polyimide film that can act as a flexible replacement for glass is included in an electronic device. FIG. 2 illustrates the case when the electronic device 200 is an organic electronic device. The device 200 has a substrate 100, an anode layer 110 and a second electrical contact layer, a cathode layer 130, and a photoactive layer 120 between them. Additional layers may optionally be present.

Adjacent to the anode may be a hole injection layer (not shown), sometimes referred to as a buffer layer. Adjacent to the hole injection layer may be a hole transport layer (not shown), including hole transport material. Adjacent to the cathode may be an electron transport layer (not shown), including an electron transport material. As an option, devices may use one or more additional hole injection or hole transport layers (not shown) next to the anode 110 and/or one or more additional electron injection or electron transport layers (not shown) next to the cathode 130. Layers between 110 and 130 are individually and collectively referred to as the organic active layers. Additional layers that may or may not be present include color filters, touch panels, and/or cover sheets. One or more of these layers, in addition to the substrate 100, may also be made from the polyimide films disclosed herein.

In some embodiments, the different layers have the following range of thicknesses: substrate 100, 5-100 microns, anode 110, 500-5000 Å, in some embodiments, 1000-2000 Å; hole injection layer (not shown), 50-2000 Å, in some embodiments, 200-1000 Å; hole transport layer (not shown), 50-3000 Å, in some embodiments, 200-2000 Å; photoactive layer 120, 10-2000 Å, in some embodiments, 100-1000 Å; electron transport layer (not shown), 50-2000 Å, in some embodiments, 100-1000 Å; cathode 130, 200-10000 Å, in some embodiments, 300-5000 Å. The desired ratio of layer thicknesses will depend on the exact nature of the materials used.

In some embodiments, the organic electronic device (OLED) contains a flexible replacement for glass as disclosed herein.

In some embodiments, there is provided an organic electronic device, wherein the device substrate comprises the polyimide film disclosed herein. In some embodiments, the device is an organic light emitting diode (OLED).

In some embodiments, an organic electronic device includes a substrate, an anode, a cathode, and a photoactive layer therebetween, and further includes one or more additional organic active layers. In some embodiments, the additional organic active layer is a hole transport layer. In some embodiments, the additional organic active layer is an electron transport layer. In some embodiments, the additional organic layers are both hole transport and electron transport layers.

In some embodiments, the device has the following structure, in order: substrate, anode, hole injection layer, hole transport layer, photoactive layer, electron transport layer, electron injection layer, cathode.

Displays are found in portable electronic consumer articles, such as laptop computers, tablets, e-readers, smartphones, and electronic toys. These consumer articles include an assembly which typically comprises a cover layer, touch screen panel, display panel, camera, and one or more sensors. The display panel comprises an active display layer, a thin film transistor (TFT) layer, and a substrate. Cover layers, touch screen panels, cameras, and sensors are well known in the art.

Figure 3:
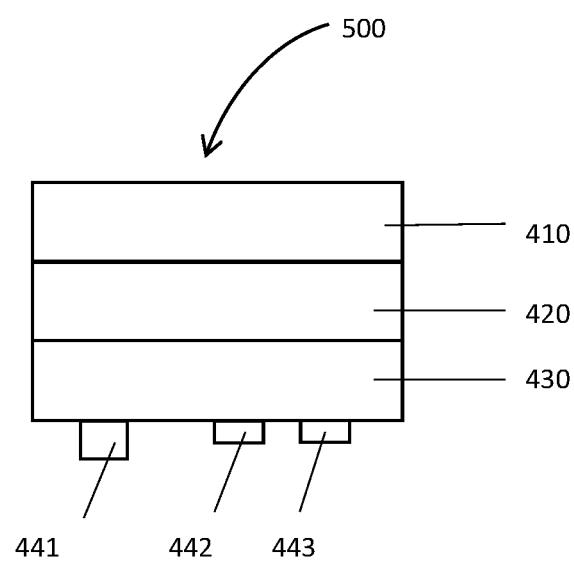
FIG. 3 includes an illustration of a smartphone assembly.

In the consumer articles, particularly for smartphones, it is desirable to maximize the screen viewing area. This requires that the camera and sensors be located behind the display panel. This is illustrated schematically in FIG. 3. Assembly 500 has a cover layer 410, a touch screen panel 420, and display panel 430. In the figure, 410, 420, and 430 may represent a single layer or more than one layer. In addition, 410, 420, and 430 may be in direct contact or there may be one or more additional layers in between them, not shown. Behind the display panel, on the side opposite the touch screen panel, are camera 441, and optional sensors 442 and 443.

Figure 4:
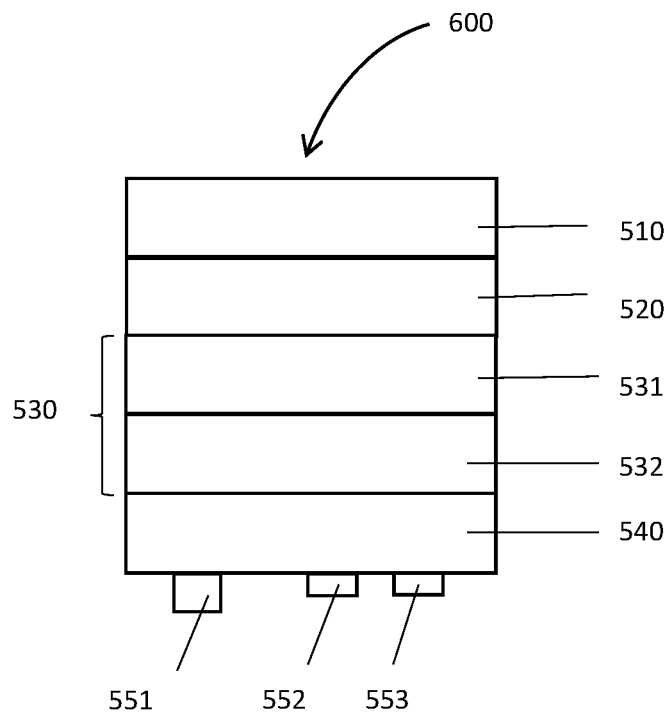
FIG. 4 includes another illustration of a smartphone assembly.

This is further illustrated schematically in FIG. 4. Assembly 600 has a cover layer 510, a touch screen panel 520, display panel 530, and substrate 540. In the figure, 510, 520, and 530 may represent a single layer or more than one layer. In addition, 510, 520, and 530 may be in direct contact or there may be one or more additional layers in between them, not shown. Behind the display panel, on the side of the substrate and opposite the touch screen panel, are camera 551, and optional sensors 552 and 553. Display panel 530 includes the active display 531 and TFT layer 532. The active display 531 includes two electrical contact layers and one or more active layers therebetween. In some embodiments, the active layer(s) are the organic active layers of an OLED, as described above. In some embodiments, the active layer is a liquid crystal layer. Additional layers which may be present include, but are not limited to, hardcoat outer layers, color filters, optically clear adhesive layers, backlights, and protective layers.

In some embodiments, the active display comprises an anode, a photoactive layer, and a cathode.

The display panel substrate 540 in this configuration must be optically clear and also be able to withstand the processing temperature for the TFT layer 532. For low-temperature polycrystalline silicon (LTPS) TFTs, the processing temperature can be in the range of 450–500° C. It is desirable for substrate 540 to have a b*≤10 and a Tg≥450° C.

In some embodiments, there is provided an assembly comprising, in order, a cover layer, a touchscreen panel, an active display, a TFT layer, and a substrate, wherein a camera and optionally one or more sensors are on an outer side of the substrate, and further wherein the substrate comprises a polyimide film having Formula III or Formula VI, as described above.

In some embodiments, there is provided an assembly comprising, in order, a cover layer, a touchscreen panel, an active display, a TFT layer, and a substrate, wherein a camera and optionally one or more sensors are on a side of the substrate opposite the TFT layer, and further wherein the substrate comprises a polyimide film having Formula III or Formula VI, as described above.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further illustrated in the following examples, which do not limit the scope of the invention described in the claims.
Abbreviations:
6FDA=4,4'-hexafluoroiso-propylidenebisphthalic dianhydride
BPDA=3,3,4,4-biphenyl tetracarboxylic dianhydride
PMDA=pyromellitic dianhydride
TAHQ=bis(1,3-dioxo-1,3-dihydroisobenzofuran-5-carboxylic acid) 1,4-phenylene ester
TFMB=2,2'-bis(trifluoromethyl) benzidine Synthesis Example 1

This example illustrates the preparation of diamine Compound II-1.

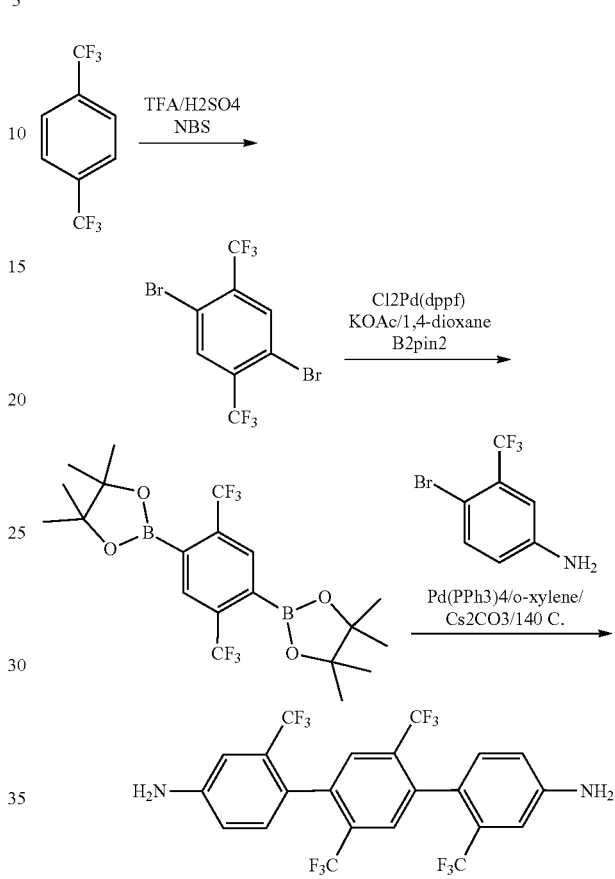

1,4-Dibromo-2,5-bis(trifluoromethyl)benzene

To a stirred mixture of trifluoroacetic acid (300 mL) and sulfuric acid (60 mL was added 1,4-bis-trifluoromethylbenzene (25 g, 116.8 mmole) at once, the mixture was heated to reflux and cooled down to 60° C. followed by addition of N-bromosuccinimide (64.5 g, 362 mmole) portion-wise over period of 2 hours. Reaction mixture was heated at 60° C. for 23 hours, cooled down, precipitated product collected by filtration, washed with water, dried using rotary evaporator to give 17.97 g of the product. Filtrate was poured into 340 g of ice and additional amount of precipitate collected by filtration, dried using rotary evaporator to give 18.45 g of the product with lower purity. $^1$H-NMR (CDCl$_3$): 8.01 (s, 2H).

2,2'-[2,5-bis(trifluoromethyl)-1,4-phenylene]bis[4,4,5,5-tetramethyl-1,3,2-dioxaborolane A mixture of the above 1,4-dibromo-2,5-bis-trifluoromethylbenzene (17.97 g, 48.32 mmole), bis(pinacolato)diboron (25.9 g, 102 mmole, 2.1 equivalents), potassium acetate (24 g, 24.45 mmole, 5 equivalents), (1,1'-bis(diphenylphosphino)ferrocene)palladium(II) dichloride (3.65 g, 4.99 mmole) and 1,4-dioxane (250 mL) was heated at 100° C. under nitrogen atmosphere for 19 hours. Reaction mixture cooled down, transferred to fumehood, passed through a filter filled with basic alumina, silica gel and Celite® washing with toluene. Solvents evaporated using rotary evaporator to volume approx. 30 mL, precipitate collected by filtration. Filtrate evaporated further to volume approx. 10 mL, additional amount of the precipitate collected by filtration, washed with methanol. Total yield—14.36 g. $^1$H-NMR (CDCl$_3$): 1.38 (s, 24H), 7.99 (s, 2H).

2,2',5',2"-Tetra(trifluoromethyl)-[1,1':4',1"-terphenyl]-4,4"-diamine

A mixture of 2,2'-[2,5-bis(trifluoromethyl)-1,4-phenylene]bis[4,4,5,5-tetramethyl-1,3,2-dioxaborolane (10.04 g, 21.5 mmole), 4-bromo-3-trifluoromethyl-aniline (15.48 g, 64.5 mmole, 3 equivalents), cesium carbonate (35.03 g, 107.5 mmole, 5 equivalents), tetrakis(triphenylphosphine)palladium(0) (2.48 g, 2.15 mmole, 10 mol %), o-xylene (200 mL) was heated at 140° C. under nitrogen atmosphere for overnight. After that reaction mixture cooled down, passed through a filter filled with silica gel and Celite® eluting with dichloromethane. The mixture was purified by column chromatography on silica gel using gradient elution with mixtures of hexanes and dichloromethane. Fractions containing product combined and purified by fractional crystallization. $^1$H-NMR (mixture of atropisomers, DMSO-d$_6$): 5.79 and 5.80 (s, 4H), 6.81 (dd, 2H, J1=9 Hz, J2=2 Hz), 6.98-7.707 (m, 4H), 7.64 and 7.65 (s, 2H). $^{19}$F-NMR (mixture of atropisomers, DMSO-d$_6$): 57.91, 57.86, 57.3, 57.1.

Synthesis Example 2

This example illustrates the preparation of diamine Compound V-2.

2',5'-Bis-trifluoromethyl-3,3"-bis(trifluoromethoxy)-[1,1':4',1"-terphenyl]-4,4"-diamine A mixture of 2,2'-[2,5-bis(trifluoromethyl)-1,4-phenylene]bis[4,4,5,5-tetramethyl-1,3,2-dioxaborolane (8.5 g, 18.24 mmole), 2-trifluoromethoxy-4-bromo-aniline (11.67 g, 45.6 mmole, 2.5 equivalents), potassium carbonate (12.6 g, 91.2 mmole, 5 equivalents), bis(di-tert-butyl(4-dimethylaminophenyl)phosphine)dichloropalladium(II) (0.354 g, 3.03 mmole, 0.5 mol %), toluene (100 mL), water (20 mL) and ethanol (40 mL) was degassed and heated at 95° C. under nitrogen atmosphere for 6 hours. After that reaction mixture cooled down, treated with water and stirred in the air for 30 min followed by addition of ethyl acetate. Organic phase separated, aqueous phase extracted with ethyl acetate, combined ethyl acetate solution absorbed onto Celite® using rotary evaporator and purified by chromatography on silica gel using gradient elution with mixtures of hexanes and dichloromethane. Fractions containing product combined, eluate evaporated, the residue dissolved in dichloromethane-methanol mixture. Precipitates after evaporation of solvents using rotary evaporator were collected portion-wise to give totally 8.496 g of the desired product with purity greater than 99.63% by UPLC. MS: 565 (MH+). $^1$H-NMR (DMSO-d$_6$): 5.88 (s, 4H), 6.88 (d, 2H, J=9 Hz), 7.11 (dd, 2H, J1=8 Hz, J2=2 Hz), 7.14 (s, 2H), 7.72 (s, 2H). $^{13}$C-NMR (DMSO-d$_6$): 142.0, 139.5, 134.2, 130.7, 129.0, 124.7, 122.7, 122.1, 116.4. $^{19}$F-NMR (DMSO-d$_6$): 56.9, 56.4.

Synthesis Example 3

This example illustrates the preparation of diamine Compound II-2.

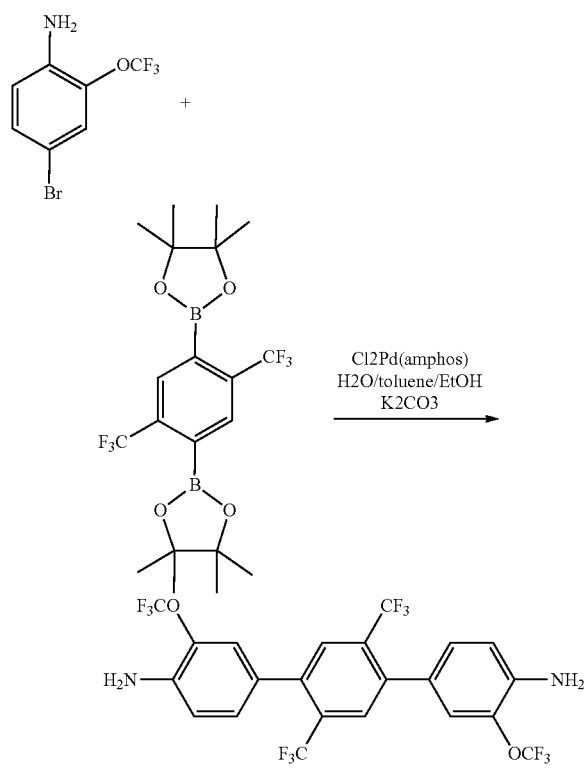

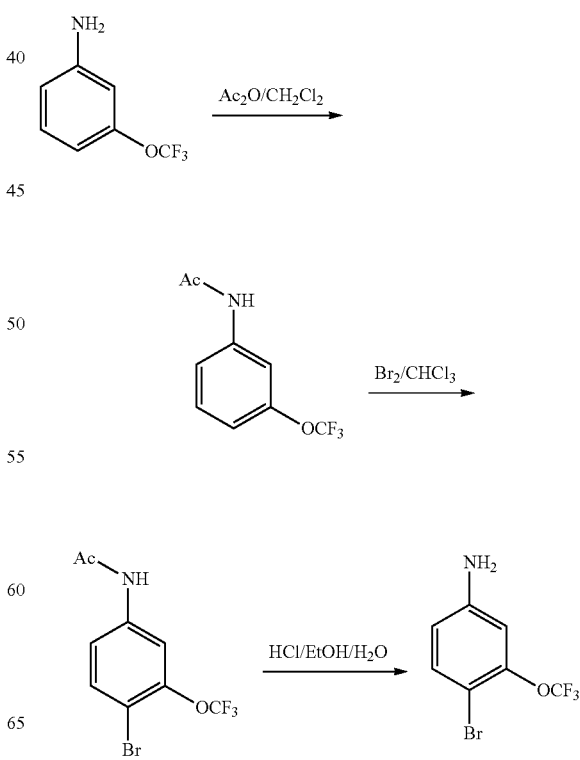

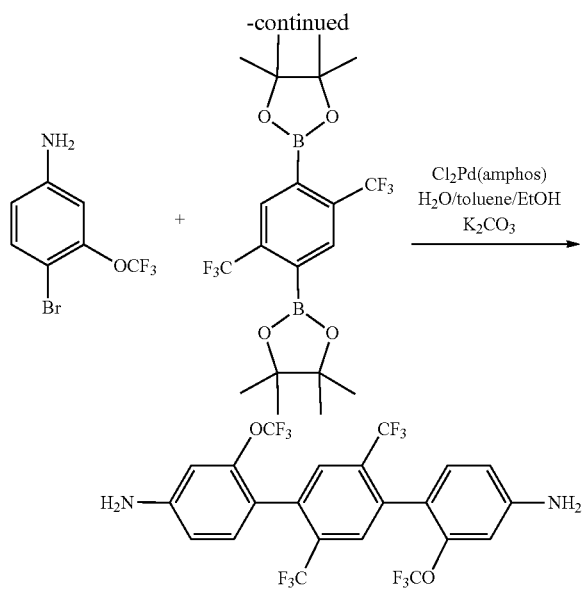

N-[3-(Trifluoromethoxy)phenyl]acetamide

To a stirred solution of 3-(trifluoromethoxy)aniline (51.4 g, 0.29 mole) in 400 mL of dichloromethane was added dropwise acetic anhydride (32.4 g, 0.317 mole) under nitrogen atmosphere cooling the mixture with ice/water bath. Solvents distilled off, the residue dissolved in 100 mL of methanol and precipitated with 200 mL of water. Solids filtered, dried in vacuum to give 61.3 g (0.28 mole, 96%) of N-[3-(trifluoromethoxy)phenyl]acetamide. $^1$H-NMR (CDCl3): 2.18 (s, 3H), 6.96 (d, 1H, J=7 Hz), 7.31 (t, 1H, J=8 Hz), 7.37 (d, 1H, J=8 Hz), 7.45 (br. s, 1H), 7.54 (br. s, 1H).

N-[4-Bromo-3-(trifluoromethoxy)phenyl]acetamide

To a stirred solution of N-[3-(trifluoromethoxy)phenyl]acetamide (61.3 g, 0.28 mole) in 700 mL of chloroform was added dropwise bromine maintaining internal temperature below 26° C. over period of 0.5 hours and the mixture stirred at ambient temperature. Precipitate formed after 1 hour was collected by filtration, washed with small amount of chloroform, dried in vacuum to give 31.4 g of N-[4-bromo-3-(trifluoromethoxy)phenyl]acetamide that was used for the next step without further purification. Chloroform solution can be further evaporated and purified using column chromatography on silica gel to separate regioisomeric bromides to give additional amount of the product. $^1$H-NMR (CDCl3): 2.18 (s, 3H), 7.31 (dd, 1H, J1=9 Hz, J2=2 Hz), 7.53 (d, 1H, J=9 Hz), 7.66 (br. s, 1H), 7.68 (br. s, 1H).

4-Bromo-3-(trifluoromethoxy)aniline

A mixture of N-[4-bromo-3-(trifluoromethoxy)phenyl]acetamide (31.4 g), ethanol (90 mL), water (30 mL), concentrated hydrochloric acid (20 mL) was heated at 100° C. under nitrogen atmosphere with stirring for 2 hours. Reaction mixture cooled down, diluted with water (300 mL), basified with aq. sodium hydroxide, extracted with dichloromethane. Dichloromethane distilled to minimal volume, diluted with hexanes and purified on flash silica gel short column eluting with mixture of hexanes-dichloromethane 7:3 to dichloromethane. The residue after evaporation of fractions containing pure product dried to give 4-bromo-3-(trifluoromethoxy)aniline (18 g), fraction with small impurities could also be recovered (approx. 2.5 g). $^1$H-NMR (CDCl3): 3.82 (br. s, 2H), 6.49 (dd, 1H, J1=9 Hz, J2=3 Hz), 6.62-6.64 (m, 1H), 7.33 (d, 1H, J=9 Hz).

2',5'-Bis-trifluoromethyl-2,2''-bis-trifluoromethoxy-[1,1':4',1''-terphenyl]-diamine, Compound II-2

A mixture of 2,2'-[2,5-bis(trifluoromethyl)-1,4-phenylene]bis[4,4,5,5-tetramethyl-1,3,2-dioxaborolane (16.3 g, 34.98 mmole), 4-bromo-3-(trifluoromethoxy)aniline (18 g, 70.31 mmole, 2.01 equivalents), potassium carbonate (24.17 g, 174.9 mmole, 5 equivalents), bis(di-tert-butyl(4-dimethylaminophenyl)phosphine)dichloropalladium(II) (0.743 g, 1.049 mmole, 3 mol %), toluene (200 mL), water (40 mL) and ethanol (80 mL) was degassed and heated at 100° C. under nitrogen atmosphere for 1.5 hours. After that reaction mixture cooled down, diluted with water (200 mL). Organic phase separated, passed through a filter filled with basic alumina, florisil and silica gel eluting with dichloromethane. Solvents distilled off using rotary evaporator to minimal volume and crude product precipitated by addition of hexanes. Product collected by filtration, dissolved in 80 mL of hot dichloromethane followed by addition of 40 mL of hexanes. Precipitate collected by filtration, dried in vacuum to give 7.37 g of the product with purity 99.86% by HPLC. Filtrate precipitated with hexanes to give 3.255 g of the product. Combined yield—10.63 g. MS: 565 (MH+). $^1$H-NMR (DMSO-d$_6$): 5.78 (br. s, 4H), 6.60-6.68 (m, 4H), 7.07-7.12 (m, 2H), 7.66 and 7.68 (s, atropoisomers, 2H). $^{19}$F-NMR (DMSO-d$_6$, atropoisomers): 55.9, 55.5, 58.36, 58.43.

Synthesis Example 4

This example illustrates the synthesis of short chain oligophenylenediamines.

A mixture of 2,2'-[2,5-bis(trifluoromethyl)-1,4-phenylene]bis[4,4,5,5-tetramethyl-1,3,2-dioxaborolane (20.038 g, 43.0 mmole, 2 equivalents), 1,4-dibromo-2,5-bis(trifluoromethyl)benzene (7.998 g, 21.51 mmole, 1 equivalent), 4-bromo-3-(trifluoromethyl)aniline (10.32 g, 43.0 mmole, 2 equivalents), bis(di-tert-butyl(4-dimethylaminophenyl)phosphine)-dichloropalladium(II) (163 mg, 0.23 mmole, 0.53 mol % based on boronate), cesium fluoride (18.4 g, 121.13 mmole, 5.6 equivalents), aliquat-336 (0.803 g) in toluene (200 mL), water (40 mL), ethanol (80 mL) was degassed and heated to slight reflux at 95° C. for 1 hour followed by addition of another portion of 4-bromo-3-(trifluoromethyl)aniline (3.3 g, 13.7 mmole, 0.64 equivalents; 2.64 equivalents totally) and heating the mixture for 1-1.5 hours. After that the reaction mixture cooled down and was allowed to stand overnight at ambient temperature for precipitation of fraction of higher molecular weight oligomers. Reaction mixture diluted with water (100 mL), precipitate of higher oligomeric fractions collected by filtration, dried in vacuum overnight to give 3.24 g of higher oligomers. Toluene layer from the filtrate was separated, passed through silica gel column eluating with mixtures of hexanes-dichloromethane 1:1 to 3:7 to eluate excess of aniline and monoamine oligomers followed by dichloromethane to eluate fraction of shorter diamine oligomers.

Dichloromethane was evaporated using rotary evaporator to volume approx. 10 mL, the mixture treated with 20 mL of hexanes, precipitate collected by filtration, dried in vacuum. Average yield of shorter oligomeric portion after two reaction runs—approx. 5.6 g per reaction. Composition of short phenylenediamines according to HPLC data (MS, MH+): terphenyldiamines—48.84% (MH+-533), quarterphenyldiamines—4.32% (MH+-745), quinquephenyldiamines—45.27% (MH+-957), sexiphenyldiamines—1.57% ((MH+CH3CN)$^{(2+)}$-605), (septiphenyldiamines ((MH+CH3CN)$^{(2+)}$-711), and higher—less than 1%).

Synthesis Example 5

This example illustrates the synthesis of longer chain oligophenylenediamines.

A mixture of 2,2'-[2,5-bis(trifluoromethyl)-1,4-phenylene]bis[4,4,5,5-tetramethyl-1,3,2-dioxaborolane (19.38 g, 41.59 mmole, 2 equivalents), 1,4-dibromo-2,5-bis(trifluoromethyl)benzene (7.736 g, 20.81 mmole, 1 equivalent), 4-bromo-3-(trifluoromethyl)aniline (4.994 g, 20.81 mmole, 1 equivalent), bis(di-tert-butyl(4-dimethylaminophenyl)phosphine)dichloropalladium(II) (320 mg, 0.4646 mmole), cesium fluoride (17.7 g, 116.5 mmole, 5.6 equivalents), aliquat-336 (0.78 g) in toluene (200 mL), water (40 mL), ethanol (80 mL) was degassed and heated to slight reflux at 95 C for 1 hour followed by addition of another portion of 4-bromo-3-(trifluoromethyl)aniline (1.5 g, 6.24 mmole) and heating the mixture for 5 hours. After that reaction mixture cooled down and allowed to stand overnight at ambient temperature for precipitation of fraction of higher molecular weight oligomers. Reaction mixture diluted with water (100 mL), precipitate of higher oligomeric fractions collected by filtration, dried in vacuum overnight to give 6.26 g of higher molecular weight oligomers. Additional amount of precipitate (1.269 g) formed from the filtrate after several days that according to HPLC data was predominantly a mixture of quinquephenyldiamines (MH+-957) and sexiphenyldiamines ((MH+CH3CN)$^{(2+)}$-605). Fraction of higher oligomers (6.26 g) could be further purified treating solids with 200 mL of hot tetrahydrofuran, filtration, evaporation of tetrahydrofuran to approximately 10 mL and fractional precipitation on longer oligomers with hexanes (100 mL). Composition the first fraction of enriched longer chain phenylenediamines according to HPLC data: shorter oligomers approx. 24%, quinquephenylenes—16% (quinquephenyldiamines, MH+-957), sexiphenylenes—39% (sexiphenyldiamines—((MH+CH3CN)$^{(2+)}$-605), septiphenylenes—10% (septiphenyldiamines—((MH+CH3CN)$^{(2+)}$-711), octaphenylenes—8% (octaphenyldiamines—((MH+CH3CN)$^{(2+)}$-817), noviphenylenes—2% (noviphenyldiamines—((MH+CH3CN)$^{(2+)}$-923), higher oligomers (<1%).

Synthesis Example 6

This example illustrates the preparation of diamine Compound II-27.

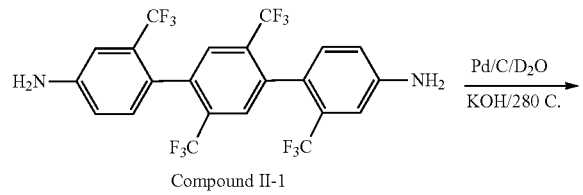

Compound II-1

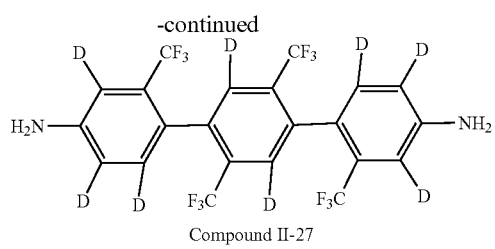

Compound II-27

2,2',2",5'-Tetrakis(trifluoromethyl)-[1,1':4',1"-terphenyl]-4,4"-diamine-d$_8$ (Compound II-27

400 mL Hastelloy shaker tube reactor was charged with 2,2',2",5'-tetrakis(trifluoromethyl)-[1,1':4',1"-terphenyl]-4,4"-diamine (20 g), deuterium oxide (200 g), 5% palladium on carbon (1.6 g), potassium hydroxide (0.8 g), cool evacuated, sealed and heated at 280 C for 4 hours with agitation. After that content of the reactor was diluted with toluene, passed through a filter filled with Celite® washing with chloroform and dichloromethane and then with tetrahydrofuran. Aqueous phase separated, extracted with chloroform (2 times), chloroform and dichloromethane phases combined. Solvents were removed using rotary evaporator to volume approx. 20 ml, precipitate collected by filtration, dried to give 13.28 g of the product. Filtrate diluted with hexanes, precipitates collected by filtration, dried to give 3.27 g of the product. Tetrahydrofuran was distilled off using rotary evaporator, the residue treated with hexanes, precipitate filtered, dried to give 0.75 g of the product. Total yield of crude product after passing through Celite®—17.3 g. Crude product was further purified dissolving in tetrahydrofuran, passing through a filter filled with neutral alumina, evaporating tetrahydrofuran and crystallizing the reside from dichloromethane with addition of hexanes to give product with purity greater than 99.5% by UPLC. Product with purity greater than 99.98% by UPLC was obtained using column chromatography purification on silica gel column using gradient eluation with mixtures of hexanes and dichloromethane. MS: M+=540. UV-vis (acetonitrile-water): $\lambda_{max}$=305 (sh), 249 nm.

Polyamic Acid Example 1

This example illustrates the preparation of a polyamic acid, PAA-1, using a diamine having Formula II, Compound II-1.

Into a 250 mL reaction flask equipped with a nitrogen inlet and outlet, and mechanical stirrer were charged 10.65 g of M1133 (0.02 moles) and 84.01 g of 1-Methyl-2-Pyrrolidinone (NMP). The mixture was agitated under nitrogen at room temperature for about 30 minutes. Afterwards, 5.65 g of BPDA (0.0192 moles) was added slowly in portions to the stirring solution of the diamine followed by 0.18 g of 6FDA (0.0004 moles) in portions. The addition rate of the dianhydrides was controlled, to keep the maximum reaction temperature <30° C. After completion of the dianhydride addition, and additional 9.33 g of NMP were used to wash in any remaining dianhydride powder from containers and the walls of the reaction flask. and the resulting mixture was stirred for 9 days. BPDA added in small amounts (~0.029 g) over time to increase the molecular weight of the polymer and viscosity of the polymer solution. Brookfield cone and plate viscometry was used to monitor the solution viscosity by removing small samples from the reaction flask for testing. A total of 0.087 g (0.0003 moles) of BPDA was added. The reaction proceeded overnight at room temperature under gentle agitation to allow for polymer equilibration. Final viscosity of the polymer solution was 23,060 cps at 25 C.

Polyamic Acid Examples 2-7

Polyamic acids PAA-2 through PAA-7 were prepared in a manner analogous to Polyamic Acid Example 1. PAA-6 was prepared in dimethyl acetamide (DMAc) instead of NMP.

The compositions are summarized below in Table 1.

TABLE 1

| PAA Example | Dianhydride (mol %) | | | | Diamine (mol %) | |
|---|---|---|---|---|---|---|
| | 6FDA | BPDA | PMDA | TAHQ | Comp. II-1 | TFMB |
| PAA-1 | 2 | 98 | | | 100 | |
| PAA-2 | 5 | 95 | | | 50 | 50 |
| PAA-3 | 10 | 60 | 30 | | 20 | 80 |
| PAA-4 | 10 | | 80 | 10 | 50 | 50 |
| PAA-5 | 20 | | 80 | | 50 | 50 |
| PAA-6 | 20 | 10 | 70 | | 50 | 50 |
| PAA-7 | 10 | | 80 | 10 | 20 | 80 |

Polyamic Acid Example 8

This example illustrates the preparation of a polyamic acid, PAA-8, using a diamine having Formula II, deuterated compound II-27.

Into a 250 mL reaction flask equipped with a nitrogen inlet and outlet, and mechanical stirrer were charged 6.578 g of deuterated compound II-27 (0.01217 moles), 49 ml of 1-Methyl-2-Pyrrolidinone (NMP), 3.419 g of BPDA (0.01162 moles). The mixture was agitated under nitrogen at room temperature for about 3 hours followed by addition of 0.108 g of 6FDA (0.00024 moles) dissolved in 3 ml of NMP. BPDA (55 mg) in 6 ml of NMP added in small amounts over time to increase the molecular weight of the polymer until final viscosity of the polymer solution was 7255 cP at 25° C.

Film Examples 1-7

These examples illustrate the preparation of polyimide films from the polyamic acids prepared above. PAA-1 was used to form polyimide film PI-1; PAA-2, to form PI-2; PAA-3, to form PI-3; PAA-4 to form PI-4; PAA-5, to form PI-5; PAA-6, to form PI-6; PAA-7, to form PI-7.

Each polyamic acid solution from Polyamic Acid Examples 1-7 was filtered through microfilter, spun coated onto clean silicon wafers, soft-baked at 90° C. on hotplate, placed into a furnace. The furnace was purged with nitrogen and heated to a maximum cure temperature in stages. Wafers were removed from furnace, soaked in water and manually delaminated to yield samples of polyimide film. The cure temperatures and film properties are given below in Table 2.

A Hunter Lab spectrophotometer was used to measure $b^*$ and yellow index along with % transmittance (% T) over the wavelength range 360 nm-780 nm. Thermal measurements on films were made using a combination of thermogravimetric analysis and thermomechanical analysis as appropriate for the specific parameters reported herein. Mechanical properties were measured using equipment from Instron.

TABLE 2

| | Film Properties | | | | | | |
|---|---|---|---|---|---|---|---|
| | Polyimide Film | | | | | | |
| | PI-1 | PI-2 | PI-3 | PI-4 | PI-5 | PI-6 | PI-7 |
| Cure | 450 | 450 | 430 | 430 | 430 | 430 | 430 |
| Thick. | 11.47 | 9.44 | 9.61 | 9.44 | 9.99 | 9.99 | 9.66 |
| Tg | >450 | >450 | >450 | >450 | >450 | >450 | >450 |
| CTE | 28 | 41 | 25 | 6.6 | 12 | 14.2 | 4.9 |
| Td | 561 | 540 | 533 | 513 | 519 | 513 | 528 |
| Trans. | 81.5 | 81.2 | 82.7 | 81.9 | 81.1 | 81.7 | 80.8 |
| Haze | 0.24 | 0.59 | 0.34 | 0.39 | 0.28 | 0.43 | 1.06 |
| Rth | 627 | 275 | 495 | 835 | 645 | 719 | 931 |
| b* | 6.1 | 6.0 | 4.3 | 5.8 | 7.1 | 6.6 | 6.8 |
| YI | 11.6 | 11.3 | 7.8 | 10.1 | 12.7 | 11.8 | 11.6 |

Cure temp. = maximum cure temperature, ° C.; Thick = film thickness, μm; Tg in ° C.; CTE is the second scan (50-250° C.), in ppm/° C.; Td is the temperature in ° C. at which a 1% weight loss occurs; Trans. = average transmittance (380-780 nm); Haze in %; Rth = optical retardation at 550 nm.

In all cases, the Tg of the films was greater than 450° C., which was the upper limit of the instrument used to measure Tg.

Film Example 8

This example illustrates the preparation of a polyimide film from a deuterated polyamic acid.

Polyimide film PI-8 was prepared from polyamic acid PAA-8 as described above for films PI-1 to PI-7. The maximum cure temperature was 430° C. and the resulting film thickness was 10 μm.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A liquid composition comprising
(a) a polyamic acid having a repeat unit structure of Formula I

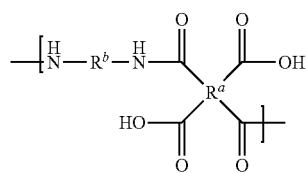

or Formula IV

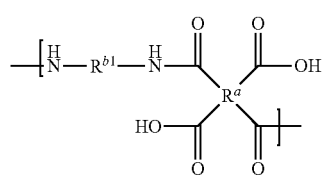

where:
$R^a$ represents one or more different tetracarboxylic acid component residues; and
$R^b$ represents one or more different aromatic diamine residues or aromatic diisocyanate residues, wherein 5-100 mol % of $R^b$ has Formula II

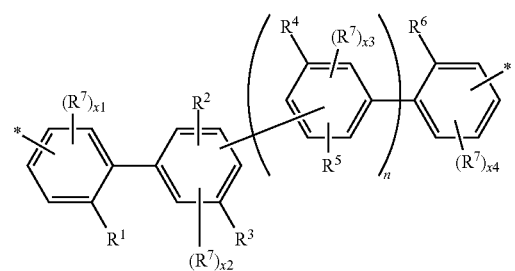

$R^{b1}$ represents one or more different aromatic diamine residues or aromatic diisocyanate residues, wherein 5-100 mol % of $R^{b1}$ has Formula V

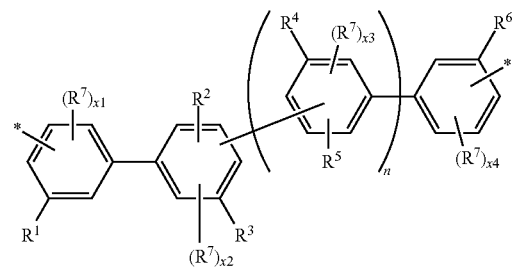

where:
$R^1$ through $R^6$ are the same or different and are selected from the group consisting of haloalkyl and haloalkoxy;
$R^7$ is the same or different at each occurrence and is selected from the group consisting of deuterium, halogen, cyano, hydroxyl, alkyl, deuterated alkyl, heteroalkyl, alkoxy, heteroalkoxy, haloalkyl, haloalkoxy, silyl, siloxy, hydrocarbon aryl, substituted hydrocarbon aryl, heteroaryl, substituted heteroaryl, vinyl, and allyl;
wherein any of $R^1$ through $R^7$ can be joined together with another of $R^1$ through $R^7$ on an adjacent ring to form a fused 5- or 6-membered alicyclic ring;
n is an integer from 0-10;
x1 and x4 are the same or different and are an integer from 0-3;
wherein x1>0 or x4>0;
x2 and x3 are the same or different and are an integer from 0-2;
* indicates a point of attachment; and
(b) at least one high-boiling aprotic solvent;
wherein a 10 μm polyimide film made from the liquid composition has a Tg greater than 400° C. and a b* value less than 10.0.

2. The liquid composition according to claim 1, wherein $R^1$ through $R^6$ are selected from the group consisting of a $C_{1-5}$ fluoroalkyl and a $C_{1-5}$ fluoroalkoxy.

3. The liquid composition according to claim 1, wherein $R^1$ through $R^6$ are a $C_{1-5}$ perfluoroalkyl.

4. The liquid composition according to claim 1, wherein $R^7$ is selected from the group consisting of deuterium, fluoro, alkyl, fluoroalkyl, alkoxy, and fluoroalkoxy.

5. The liquid composition according to claim 1, wherein n=0.

6. The liquid composition according to claim 1, wherein $R^a$ represents one or more residues from tetracarboxylic acid dianhydrides selected from the group consisting of PMDA, BPDA, s-BPDA, DSDA, 6FDA, TDA, BTDA, ODPA, and CpODA.

7. A polyimide film having a repeat unit structure of Formula III

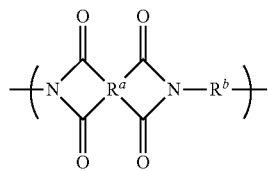

(III)

or Formula VI

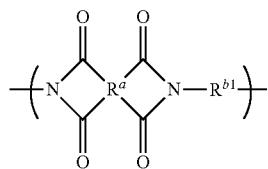

(VI)

where:

$R^a$ represents one or more different tetracarboxylic acid component residues; and $R^b$ represents one or more different aromatic diamine residues or aromatic diisocyanate residues, wherein 5-100 mol % of $R^b$ has Formula II

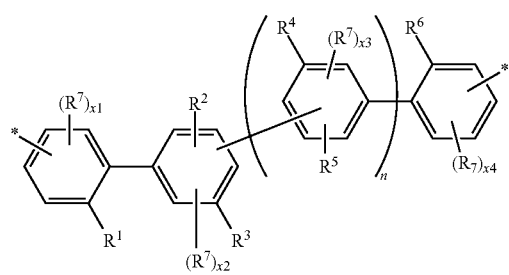

(II)

$R^{b1}$ represents one or more different aromatic diamine residues or aromatic diisocyanate residues, wherein 5-100 mol % of $R^{b1}$ has Formula V

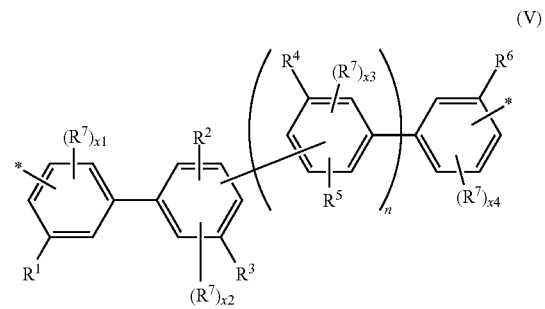

(V)

where:
R¹ through R⁶ are the same or different and are selected from the group consisting of halogen, haloalkyl, and haloalkoxy;
R⁷ is the same or different at each occurrence and is selected from the group consisting of deuterium, halogen, cyano, hydroxyl, alkyl, deuterated alkyl, heteroalkyl, alkoxy, heteroalkoxy, haloalkyl, haloalkoxy, silyl, siloxy, hydrocarbon aryl, substituted hydrocarbon aryl, heteroaryl, substituted heteroaryl, vinyl, and allyl;
wherein any of R¹ through R⁷ can be joined together with another of R¹ through R⁷ on an adjacent ring to form a fused 5- or 6-membered alicyclic ring;
n is an integer from 0-10;
x1 and x4 are the same or different and are an integer from 0-3;
wherein x1>0 or x4>0;
x2 and x3 are the same or different and are an integer from 0-2; and
* indicates a point of attachment;
wherein the polyimide film has a Tg greater than 400° C. and a b* value less than 10.0.

8. The polyimide film according to claim 7, wherein the Tg greater than 430° C.

9. The polyimide film according to claim 7, wherein R¹ through R⁶ are selected from the group consisting of a $C_{1-5}$ fluoroalkyl and a $C_{1-5}$ fluoroalkoxy.

10. The polyimide film according to claim 7, wherein R¹ through R⁶ are a $C_{1-5}$ perfluoroalkyl.

11. The polyimide film according to claim 7, wherein R⁷ is selected from the group consisting of deuterium, fluoro, alkyl, fluoroalkyl, alkoxy, and fluoroalkoxy.

12. The polyimide film according to claim 7, wherein n=0.

13. An organic electronic device having at least one layer comprising a polyimide film having a repeat unit of Formula III, according to claim 7.

14. The electronic device according to claim 13, wherein the layer is used in device components selected from the group consisting of device substrates, substrates for color filter sheets, cover films, and touch screen panels.

15. A liquid composition comprising
(a) a polyamic acid having a repeat unit structure of Formula I

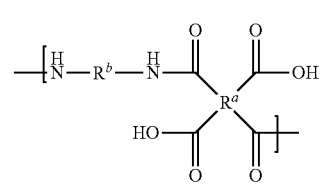

(I)

or Formula IV

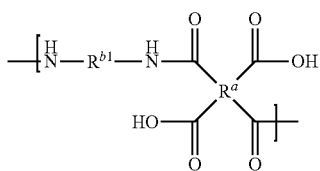

(IV)

where:
R$^a$ represents one or more different tetracarboxylic acid component residues; and
R$^b$ represents one or more different aromatic diamine residues or aromatic diisocyanate residues, wherein 5-100 mol % of R$^b$ has Formula II

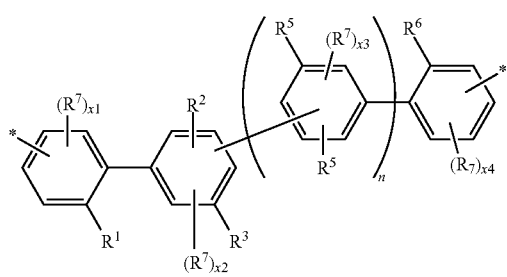

(II)

R$^{b1}$ represents one or more different aromatic diamine residues or aromatic diisocyanate residues, wherein 5-100 mol % of R$^{b1}$ has Formula V

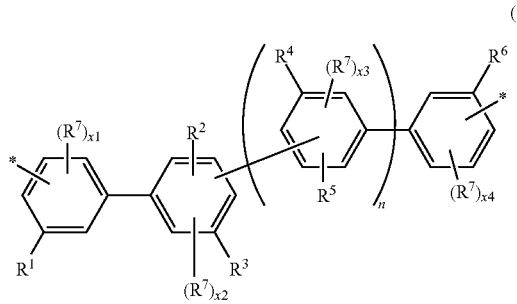

(V)

where:
R$^1$ through R$^6$ are the same or different and are selected from the group consisting of haloalkyl and haloalkoxy;
R$^7$ is the same or different at each occurrence and is selected from the group consisting of deuterium, halogen, cyano, hydroxyl, alkyl, deuterated alkyl, heteroalkyl, alkoxy, heteroalkoxy, haloalkyl, haloalkoxy, silyl, siloxy, hydrocarbon aryl, substituted hydrocarbon aryl, heteroaryl, substituted heteroaryl, vinyl, and allyl;

wherein any of R$^1$ through R$^7$ can be joined together with another of R$^1$ through R$^7$ on an adjacent ring to form a fused 5- or 6-membered alicyclic ring;
n is an integer from 3-10;
x1 and x4 are the same or different and are an integer from 0-3;
wherein x1>0 or x4>0;
x2 and x3 are the same or different and are an integer from 0-2;
* indicates a point of attachment; and
(b) at least one high-boiling aprotic solvent.

16. A polyimide film having a repeat unit structure of Formula III

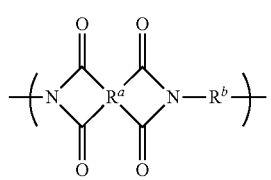

(III)

or Formula VI

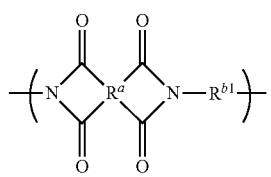

(VI)

where:
R$^a$ represents one or more different tetracarboxylic acid component residues; and
R$^b$ represents one or more different aromatic diamine residues or aromatic diisocyanate residues, wherein 5-100 mol % of R$^b$ has Formula II

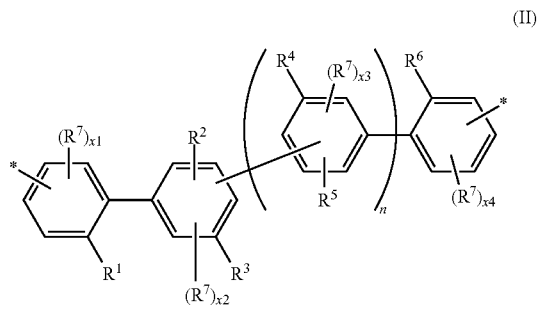

(II)

R$^{b1}$ represents one or more different aromatic diamine residues or aromatic diisocyanate residues, wherein 5-100 mol % of R$^{b1}$ has Formula V

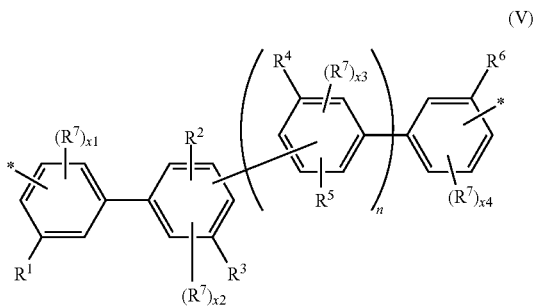

(V)

where:
R$^1$ through R$^6$ are the same or different and are selected from the group consisting of halogen, haloalkyl, and haloalkoxy;
R$^7$ is the same or different at each occurrence and is selected from the group consisting of deuterium, halogen, cyano, hydroxyl, alkyl, deuterated alkyl, heteroalkyl, alkoxy, heteroalkoxy, haloalkyl, haloalkoxy, silyl, siloxy, hydrocarbon aryl, substituted hydrocarbon aryl, heteroaryl, substituted heteroaryl, vinyl, and allyl;
wherein any of R$^1$ through R$^7$ can be joined together with another of R$^1$ through R$^7$ on an adjacent ring to form a fused 5- or 6-membered alicyclic ring;
n is an integer from 3-10;
x1 and x4 are the same or different and are an integer from 0-3;
wherein x1>0 or x4>0;
x2 and x3 are the same or different and are an integer from 0-2; and
* indicates a point of attachment.

17. An organic electronic device having at least one layer comprising a polyimide film having a repeat unit of Formula VI, according to claim 16.

18. An assembly comprising, in order, a cover layer, a touchscreen panel, an active display, a TFT layer, and a substrate, wherein a camera and optionally one or more sensors are on a side of the substrate opposite the TFT layer, and further wherein the substrate comprises a polyimide film according to claim 7.

19. An assembly comprising, in order, a cover layer, a touchscreen panel, an active display, a TFT layer, and a substrate, wherein a camera and optionally one or more sensors are on a side of the substrate opposite the TFT layer, and further wherein the substrate comprises a polyimide film according to claim 16.

20. The assembly of claim 18, wherein the active display comprises an anode, a photoactive layer, and a cathode.

* * * * *